US008771918B2

(12) United States Patent
André et al.

(10) Patent No.: US 8,771,918 B2
(45) Date of Patent: Jul. 8, 2014

(54) LITHOGRAPHIC PRINTING PLATE PRECURSOR

(75) Inventors: Xavier André, Antwerp (BE); Philippe Moriamé, Antwerp (BE); Hubertus Van Aert, Pulderbos (BE)

(73) Assignee: Agfa Graphics N.V., Mortsel (BE)

( * ) Notice: Subject to any disclaimer, the term of this patent is extended or adjusted under 35 U.S.C. 154(b) by 24 days.

(21) Appl. No.: 13/378,025

(22) PCT Filed: Jun. 3, 2010

(86) PCT No.: PCT/EP2010/057760
§ 371 (c)(1), (2), (4) Date: Dec. 13, 2011

(87) PCT Pub. No.: WO2010/145947
PCT Pub. Date: Dec. 23, 2010

(65) Prior Publication Data

US 2012/0088191 A1 Apr. 12, 2012

Related U.S. Application Data

(60) Provisional application No. 61/218,082, filed on Jun. 18, 2009.

(30) Foreign Application Priority Data

Jun. 18, 2009 (EP) .................................... 09163076

(51) Int. Cl.
*B41M 5/00* (2006.01)
*B41N 1/00* (2006.01)
*G03F 7/00* (2006.01)
*G03F 7/26* (2006.01)

(52) U.S. Cl.
USPC ..................... 430/270.1; 101/453; 101/463.1; 430/281.1; 430/283.1; 430/302

(58) Field of Classification Search
USPC ......... 430/281.1, 283.1, 270.1, 302; 101/453, 101/463.1
See application file for complete search history.

(56) References Cited

U.S. PATENT DOCUMENTS 4,045,232 A 8/1977 Parkinson
4,981,517 A 1/1991 DeSanto, Jr. et al.
5,163,368 A 11/1992 Pensavecchia et al.
5,174,205 A 12/1992 Kline et al.
5,641,608 A 6/1997 Grunwald et al.
5,900,352 A 5/1999 Elsaesser et al.
5,972,556 A * 10/1999 Leenders ...................... 430/200
6,140,392 A 10/2000 Kingman et al.
2004/0068084 A1* 4/2004 Hwang et al. ................. 528/162
2008/0045688 A1* 2/2008 Lin et al. ....................... 528/162
2009/0264317 A1* 10/2009 Ofir et al. ........................ 506/16

FOREIGN PATENT DOCUMENTS

| | | | |
|---|---|---|---|
| CN | 1826001 | A1 | 8/2007 |
| DE | 1447963 | A1 | 11/1968 |
| DE | 4007428 | A1 | 9/1991 |
| DE | 4027301 | A1 | 3/1992 |
| DE | 4445820 | A1 | 6/1996 |
| EP | 0400706 | A1 | 12/1990 |
| EP | 0625728 | A2 | 11/1994 |
| EP | 0823327 | A2 | 2/1998 |
| EP | 0864420 | A1 | 9/1998 |
| EP | 0894622 | A2 | 2/1999 |
| EP | 0901902 | A2 | 3/1999 |
| EP | 0825927 | B1 | 8/1999 |
| EP | 0933682 | A2 | 8/1999 |
| EP | 0934822 | A1 | 8/1999 |
| EP | 0950517 | A1 | 10/1999 |
| EP | 0950518 | A1 | 10/1999 |
| EP | 0982123 | A2 | 3/2000 |
| EP | 1025992 | A2 | 8/2000 |
| EP | 1029667 | A1 | 8/2000 |
| EP | 1053868 | A2 | 11/2000 |
| EP | 1072432 | A2 | 1/2001 |
| EP | 1074386 | A2 | 2/2001 |
| EP | 1074889 | A2 | 2/2001 |
| EP | 1093934 | A1 | 4/2001 |
| EP | 1342568 | A1 | 9/2003 |
| EP | 1356926 | A1 | 10/2003 |
| EP | 1400351 | A2 | 3/2004 |
| EP | 1506854 | A1 | 2/2005 |
| EP | 1506858 | A2 | 2/2005 |
| EP | 1614538 | A2 | 1/2006 |
| EP | 1614539 | A1 | 1/2006 |
| EP | 1614540 | A1 | 1/2006 |
| EP | 1621338 | A1 | 2/2006 |
| EP | 1826001 | A1 * | 8/2007 |
| EP | 1916101 | A2 | 4/2008 |
| EP | 1970367 | A2 | 9/2008 |
| EP | 1588220 | B1 | 10/2008 |
| GB | 1154749 | | 6/1969 |
| WO | 97/39894 | A1 | 10/1997 |
| WO | WO 99/01795 | | 1/1999 |

(Continued)

OTHER PUBLICATIONS

European Patent Office, International Search Report in International Patent Application No. PCT/EP2010/057760 (Jan. 11, 2011).

Hofmann, Volker, et al., "Pharmacologically Active Polymers, 11*: Polymeric Sulfonamides as Potential Antibacterials and Carriers for Antitumor Agents," *Die Makromolekulare Chemie*, vol. 177, No. 5, pp. 1791-1813 (May 1976).

Ning, Xin et al., "Phenolic Materials via Ring-Opening Polymerization: Synthesis and Characterization of Bisphenol-A Based Benzoxazines and Their Polymers," *Journal of Polymer Science: Part A: Polymer Chemistry*, vol. 32, No. 5, pp. 1121-1129 (1994).

Tamaddon, Fatemeh, et al., "($P_2O_5/SiO_2$): a useful heterogeneous alternative for the Ritter reaction," *Tetrahedron Letters*, vol. 48, No. 21, pp. 3643-3646 (2007).

*Primary Examiner* — Chanceity Robinson

(74) *Attorney, Agent, or Firm* — Leydig, Voit & Mayer, Ltd.

(57) ABSTRACT

A positive-working lithographic printing plate precursor is disclosed which comprises on a support having a hydrophilic surface or which is provided with a hydrophilic layer a heat and/or light-sensitive coating including an infrared absorbing agent and a compound including a benzoxazine group.

12 Claims, No Drawings

(56) References Cited

FOREIGN PATENT DOCUMENTS

| | | | |
|---|---|---|---|
| WO | WO 99/21725 | | 5/1999 |
| WO | WO 99/63407 | | 12/1999 |
| WO | WO 00/29214 | | 5/2000 |
| WO | WO 01/45958 | A2 | 6/2001 |
| WO | WO 2004/030923 | A2 | 4/2004 |
| WO | WO 2004/030924 | A1 | 4/2004 |
| WO | WO 2004/030925 | A1 | 4/2004 |
| WO | WO 2004/035310 | A1 | 4/2004 |
| WO | WO 2004/035645 | A1 | 4/2004 |
| WO | WO 2004/035686 | A2 | 4/2004 |
| WO | WO 2004/035687 | A1 | 4/2004 |
| WO | WO 2004/071767 | A1 | 8/2004 |
| WO | WO 2005/111727 | A1 | 11/2005 |
| WO | WO 2006/005688 | A1 | 1/2006 |

* cited by examiner

LITHOGRAPHIC PRINTING PLATE PRECURSOR

This patent application is the U.S. national stage of International Patent Application No. PCT/EP2010/057760, filed Jun. 3, 2010, which claims priority to European Patent Application No. 09163076.4, filed Jun. 18, 2009, and which also claims the benefit of U.S. Provisional Patent Application No. 61/218,082, filed Jun. 18, 2009, all of which are incorporated by reference.

FIELD OF THE INVENTION

The present invention relates to a lithographic printing plate precursor comprising a compound containing a benzoxazine group and to a new alkali soluble resin.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the image-wise exposure and processing of an imaging material called plate precursor. In addition to the well-known photosensitive, so-called pre-sensitized plates, which are suitable for UV contact exposure through a film mask, also heat-sensitive printing plate precursors have become very popular in the late 1990s. Such thermal materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-) chemical process, such as ablation, polymerization, insolubilization by cross linking of a polymer, heat-induced solubilization or particle coagulation of a thermoplastic polymer latex.

The most popular thermal plates form an image by a heat-induced solubility difference in an alkaline developer between exposed and non-exposed areas of the coating. The coating typically comprises an oleophilic binder, e.g. a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in e.g. EP-A 625728, 823327, 825927, 864420, 894622 and 901902. Negative working embodiments of such thermal materials often require a pre-heat step between exposure and development as described in e.g. EP-625,728.

Before, during and after the printing step, a lithographic printing plate is in general treated with various liquids such as for example ink and fountain solutions or treating liquids for further improving the lithographic properties of the image and non-image areas. Ink and fountain solutions may attack the coating and may reduce the lithographic quality and/or the press-life. It is also of high importance that the coating is sufficiently resistant against the application of a variety of treating liquids or in other words, has a high chemical resistance. In addition, printing plates are susceptible to damage caused by mechanical forces applied to the surface of the coating during for example automatic transport, mechanical handling, manual handling and/or printing. Mechanical damage may result in a reduced printing quality due to destruction of the surface of the coating of the printing plate and/or to a reduced press-life.

SUMMARY OF THE INVENTION

It is an object of the present invention to provide a positive-working lithographic printing plate with a high chemical and/or mechanical resistance.

A high chemical resistance means that the coating is not, or substantially not, affected by printing liquids such as ink, e.g. UV-ink, fountain solution, plate and blanket cleaners. A high mechanical resistance means that the printing plate is protected against mechanical damage occurring during plate handling and/or printing.

The object of the present invention is realized by a lithographic printing plate precursor which comprises on a support having a hydrophilic surface or which is provided with a hydrophilic layer, a heat and/or light-sensitive coating including an infrared absorbing agent and a compound including a benzoxazine group. The compound including a benzoxazine group is preferably an alkali soluble resin, or a compound according to the following structures (I) or (II):

(I)

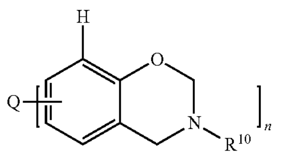

(II)

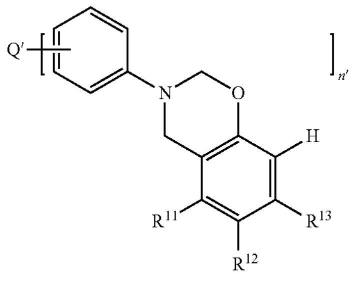

wherein

Q and Q' independently represent an optionally substituted alkylidene or hetero-alkylidene group, an optionally substituted nitrogen, an oxygen, a sulphone, a sulphoxide, a carbonyl, a thioether, a thiol or a phosphine oxide group;

$R^{10}$ represents hydrogen or an optionally substituted alkyl, alicyclic alkyl, aralkyl, aryl or heteroaryl group; and n and n' independently represent an integer comprised between 1 and 4;

$R^{11}$, $R^{12}$ and $R^{13}$ independently represent hydrogen, a halogen or an optionally substituted alkyl, alicyclic alkyl, aralkyl, aryl or heteroaryl group.

It was surprisingly found that the compound including a benzoxazine group provides to the coating of a printing plate a high chemical resistance against press liquids such as ink, fountain solution and/or treating liquids, and/or a high mechanical resistance preventing damages occurring during printing and/or plate handling.

According to the present invention, there is also provided a new class of binders comprising a monomeric unit derived from the monomer according to the following structure (III):

(III)

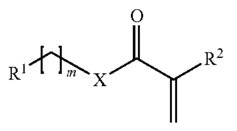

wherein

- $R^1$ represents an optionally substituted benzoxazine group;
- $R^2$ represents hydrogen or an optionally substituted alkyl group, an alkoxy ($-C_qH_{2q}OR^e$), a carboxylic acid ($-C_qH_{2q}COOH$), or an ester ($-C_qH_{2q}COOR^f$) group wherein q is preferably comprised between 1 and 12, more preferably q is equal to 1, and wherein $R^e$ and $R^f$ represent an optionally substituted alkyl group;
- X represents an optionally substituted nitrogen (—NH— or $-NR^a-$ wherein $R^a$ represents an optionally substituted alkyl group), oxygen or sulfur; preferably X is an optionally substituted nitrogen;
- m represents 0, 1 or an integer greater than 1.
- $R^1$ may be bonded via its position 1, 2, 3 or 4. Preferably $R^1$ is bonded at position 2. The figures on structure (IV) define the positions 1 to 4 on the benzoxazine group:

(IV)

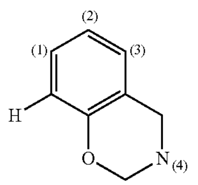

It was surprisingly found that this new binder provides to the coating of a printing plate an excellent chemical and/or mechanical resistance.

Other features, elements, steps, characteristics and advantages of the present invention will become more apparent from the following detailed description of preferred embodiments of the present invention. Specific embodiments of the invention are also defined in the dependent claims.

DETAILED DESCRIPTION OF THE INVENTION

The lithographic printing plate precursor according to the present invention comprises a heat and/or light sensitive coating on a support and is positive-working, i.e. after exposure and development the exposed areas of the coating are removed from the support and define hydrophilic (non-printing) areas, whereas the unexposed coating is not removed from the support and defines oleophilic (printing) areas.

In a first preferred embodiment, the compound including a benzoxazine group is an alkali soluble resin. The alkali soluble resin comprises a monomeric unit derived from the monomer according to the following structure (V):

(V)

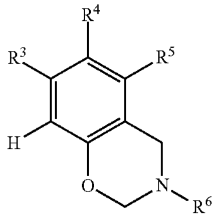

wherein $R^3$ to $R^6$ represent hydrogen, a halogen, an optionally substituted straight, branched, cyclic or alicyclic alkyl group such as methyl, ethyl, propyl, isopropyl, butyl, tertiary butyl, pentyl, cyclopentyl, cyclohexyl or adamantyl group alkyl, an optionally substituted aralkyl or hetero-aralkyl group, an optionally substituted (di)alkylamine group, an optionally substituted aryl group such as a phenyl, a benzyl, a tolyl, an ortho-meta- or para-xylyl, naphtalenic, an anthracenic, a phenanthrenic or a carbazoyl group, an optionally substituted heteroaryl group such as a pyridyl, pyrimidyl, pyrazoyl or pyridazyl group, each of adjacent $R^3$ to $R^5$ may represent the necessary atoms to form one or more cyclic structure(s)—aromatic, non aromatic or combinations thereof—or a structural moiety comprising an ethylenically unsaturated polymerisable group; and/or combinations thereof; with the proviso that at least one of $R^3$ to $R^6$ represents or comprises a structural moiety including an ethylenically unsaturated polymerisable group.

Suitable examples of ethylenically unsaturated polymerisable groups include a vinyl, a vinyl ether, an allyl, an acrylyl, a methacrylyl, an acrylamidyl, a methacrylamidyl, a maleimidyl, a norbornene functionalised maleimidyl or a cycloalkenyl group—such as a cyclopentenyl or cyclopentadienyl group.

A particularly preferred ethylenically unsaturated polymerisable group is represented by structure (VI):

(VI)

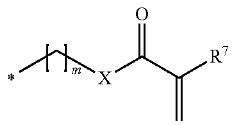

wherein

- X represents an optionally substituted nitrogen (—NH— or $-NR^b-$ wherein $R^b$ represents an optionally substituted alkyl group), oxygen or sulfur;
- m represents 0, 1 or an integer greater than 1; preferably m represents 0 or an integer up to 10; and
- $R^7$ represents hydrogen, an alkyl, an alkoxy ($-C_pH_{2p}OR^c$), a carboxylic acid ($-C_pH_{2p}COOH$), or an ester ($-C_pH_{2p}COOR^d$) group wherein p is preferably comprised between 1 and 12, more preferably p is equal to 1, and wherein $R^c$ and $R^d$ represent an optionally substituted alkyl group;
- * via this bond structure (VI) is attached to $R^3$, $R^4$, $R^5$ or $R^6$, or directly to the structure (V) at position 1, 2, 3 or 4. Most preferred, structure (VI) is attached to the position 2 of the benzoxazine group in structure (V).
- ** see structure (IV).

In a preferred embodiment, the alkali soluble resin comprises a monomeric unit derived from the monomer according to the following structure (III):

(III)

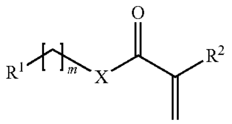

wherein $R^1$ represents an optionally substituted benzoxazine group;

$R^2$ represents hydrogen or an optionally substituted alkyl group, an alkoxy ($—C_qH_{2q}OR^e$), a carboxylic acid ($—C_qH_{2q}COOH$), or an ester ($—C_qH_{2q}COOR^f$) group wherein q is preferably comprised between 1 and 12, more preferably q is equal to 1, and wherein $R^e$ and $R^f$ represent an optionally substituted alkyl group;

X represents an optionally substituted nitrogen (—NH— or $—NR^a—$ wherein $R^a$ represents an optionally substituted alkyl group), oxygen or sulfur; preferably X is an optionally substituted nitrogen;

m represents 0, 1 or an integer greater than 1; and $R^1$ may be bonded via its position* 1, 2, 3 or 4.

Preferably, $R^1$ is bonded via its position* 2.

*: see structure (IV)

In a further preferred embodiment, the alkali soluble resin comprises a monomeric unit derived from the monomer according to the following structure (VII):

(VII)

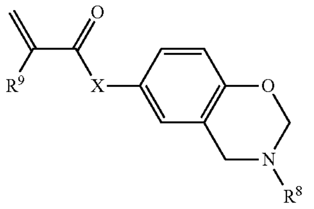

wherein $R^9$ represents hydrogen or an optionally substituted alkyl group;

$R^8$ represents hydrogen, an optionally substituted straight, branched or cyclic alkyl group such as methyl, ethyl, propyl, isopropyl, butyl, tertiary butyl, pentyl, cyclopentyl, cyclohexyl or adamantyl group, an optionally substituted aralkyl or hetero-aralkyl group, an optionally substituted (di)alkylamine group, an optionally substituted aryl group such as a phenyl, a benzyl, a tolyl, an ortho- meta- or para-xylyl, naphtalenic, an anthracenic, a phenanthrenic or a carbazoyl group, or an optionally substituted heteroaryl group such as a pyridyl, pyrimidyl, pyrazoyl or pyridazyl group;

X represents an optionally substituted nitrogen (—NH— or $—NR^e—$ wherein $R^e$ represents an optionally substituted alkyl group) or oxygen, preferably X represents an optionally substituted nitrogen.

The optional substituents on the benzoxazine group are selected from hydrogen, an optionally substituted straight, branched or cyclic alkyl group such as methyl, ethyl, propyl, isopropyl, butyl, tertiary butyl, pentyl, cyclopentyl, cyclohexyl or adamantyl group, an optionally substituted aralkyl or hetero-aralkyl group, an optionally substituted (di)alkylamine group, an optionally substituted aryl group such as a phenyl, a benzyl, a tolyl, an ortho- meta- or para-xylyl, naphtalenic, an anthracenic, a phenanthrenic or a carbazoyl group, or an optionally substituted heteroaryl group such as a pyridyl, pyrimidyl, pyrazoyl or pyridazyl group, and/or combinations thereof.

The optional substituents on the substituents $R^2$ to $R^9$ of structures (III), (V), (VI) and (VII) may be selected from an alkyl, cycloalkyl, an aryl or heteroaryl group, an alkylaryl or arylalkyl group, an alkoxy or aryloxy group, a thio alkyl, thio aryl or thio heteroaryl group, a hydroxyl group, —SH, a carboxylic acid group or an alkyl ester thereof, a sulphonic acid group or an alkyl ester thereof, a phosphonic acid group or an alkyl ester thereof, a phosphoric acid group or an alkyl ester thereof, an amino group, a sulphonamide group, an amide group, a nitro group, a nitrile group a halogen or a combination of at least two of these groups, including at least one of these groups which is further substituted by one of these groups and/or combination thereof.

Without being limited thereto, typical examples of monomers according to general structures (III), (V) and/or (VII) are given below.

benzoxazine monomer 1

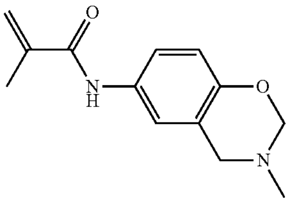

benzoxazine monomer 2

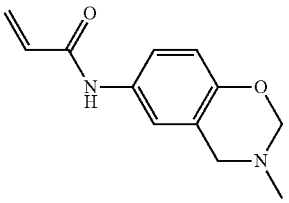

benzoxazine monomer 3

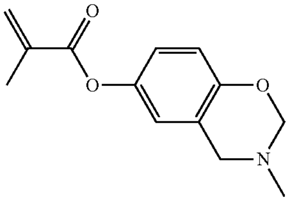

benzoxazine monomer 4

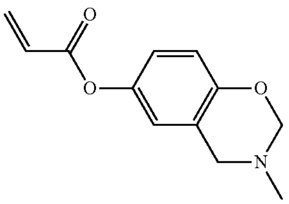

benzoxazine monomer 5

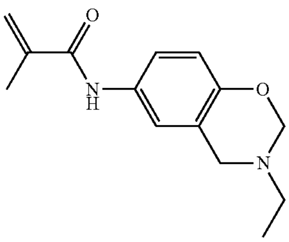

-continued
benzoxazine monomer 6
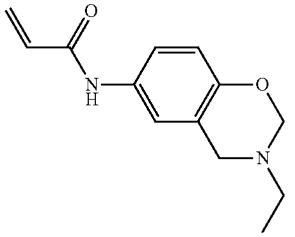
benzoxazine monomer 7
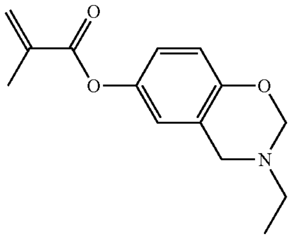
benzoxazine monomer 8
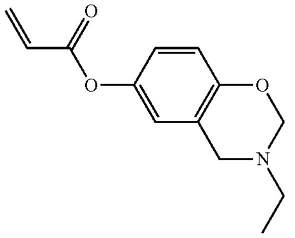
benzoxazine monomer 9
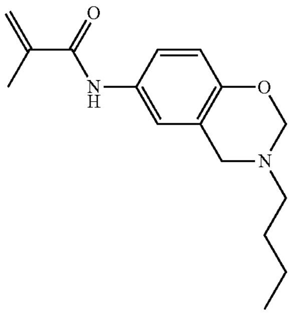
benzoxazine monomer 10
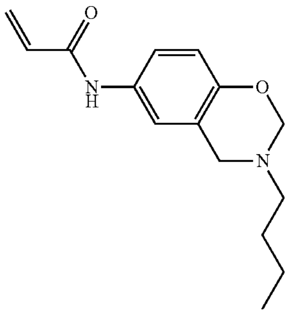
-continued
benzoxazine monomer 11
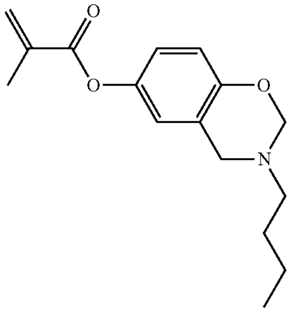
benzoxazine monomer 12
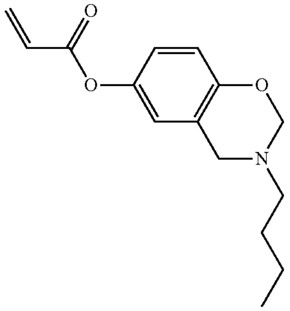
benzoxazine monomer 13
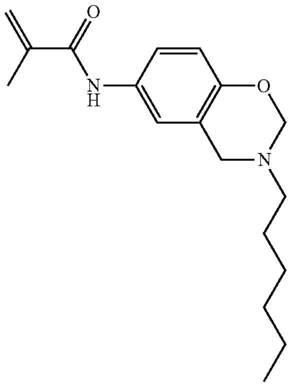
benzoxazine monomer 14
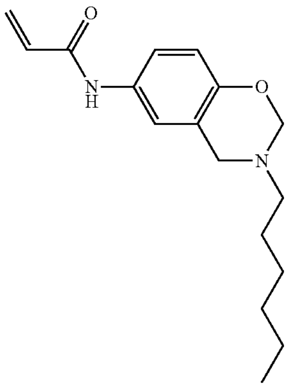

-continued
benzoxazine monomer 15
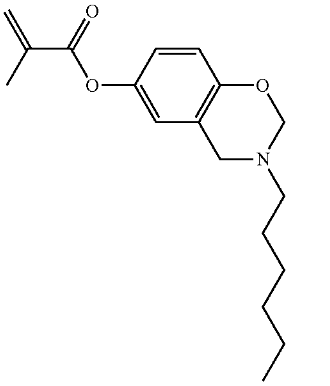
benzoxazine monomer 16
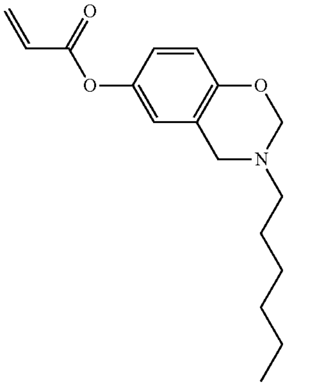
benzoxazine monomer 17
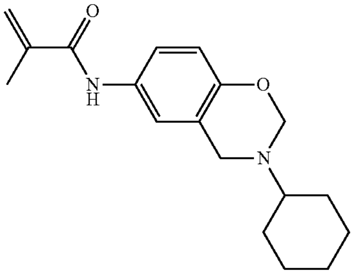
benzoxazine monomer 18
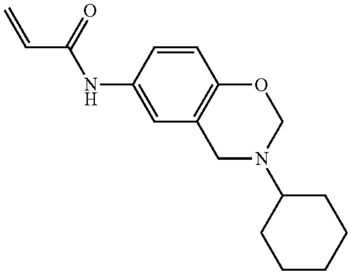
-continued
benzoxazine monomer 19
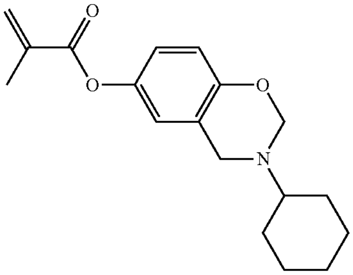
benzoxazine monomer 20
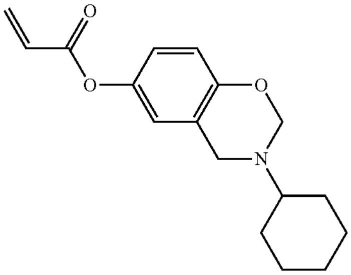
benzoxazine monomer 21
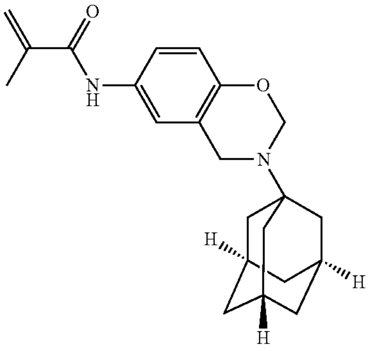
benzoxazine monomer 22
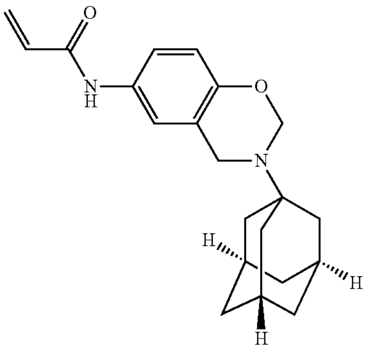

-continued
benzoxazine monomer 23
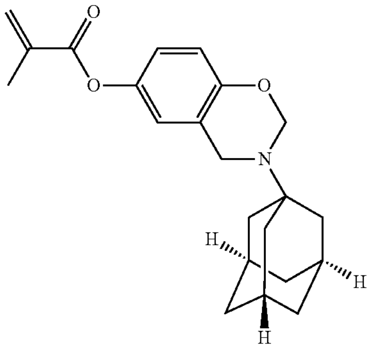
benzoxazine monomer 24
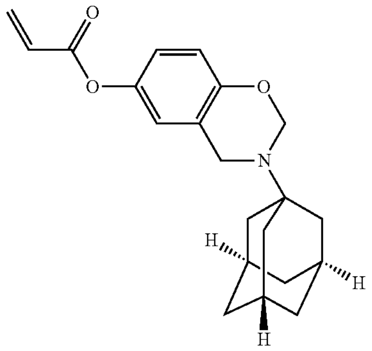
benzoxazine monomer 25
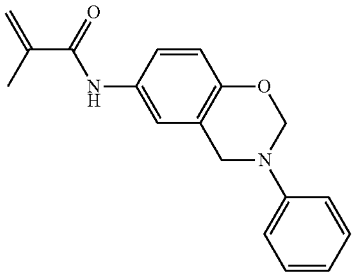
benzoxazine monomer 26
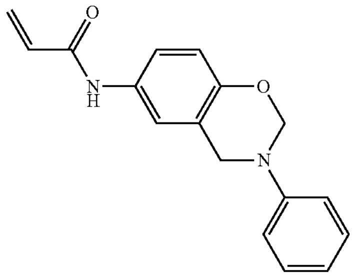
benzoxazine monomer 27
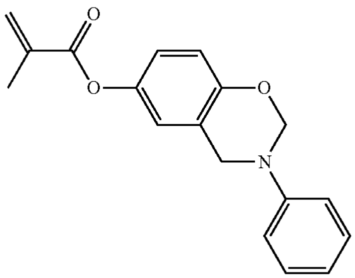
-continued
benzoxazine monomer 28
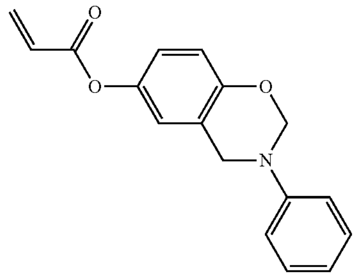
benzoxazine monomer 29
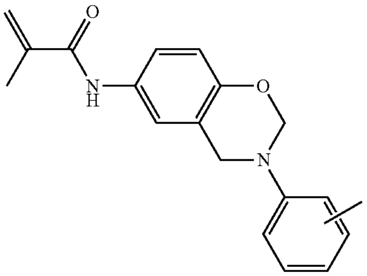
benzoxazine monomer 30
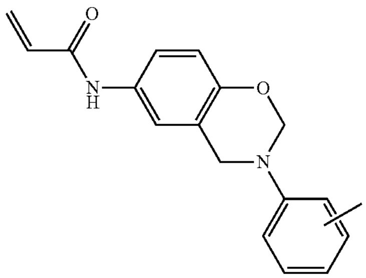
benzoxazine monomer 31
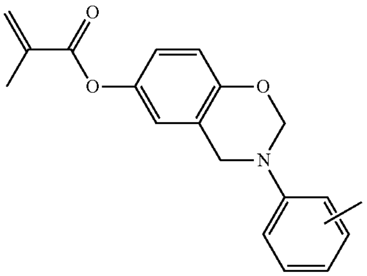
benzoxazine monomer 32
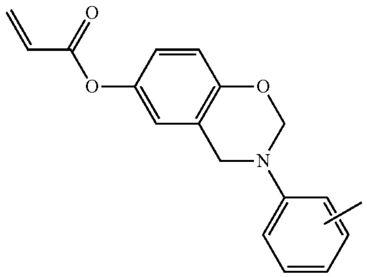

-continued benzoxazine monomer 33

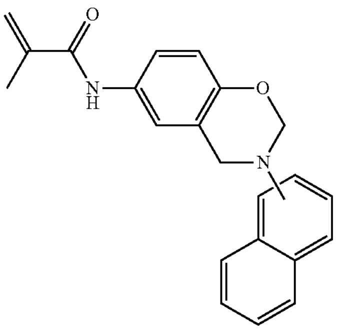

benzoxazine monomer 34

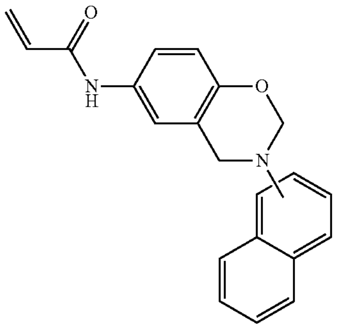

benzoxazine monomer 35

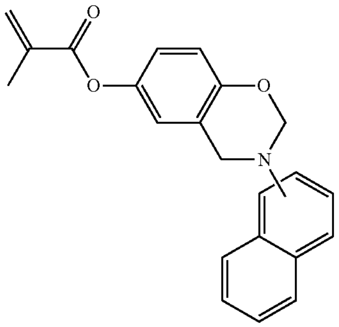

benzoxazine monomer 36

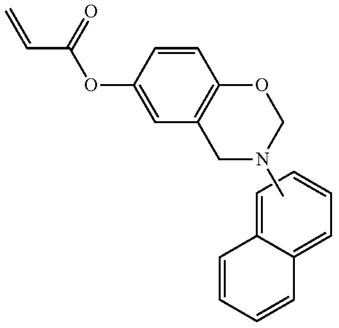

-continued benzoxazine monomer 37

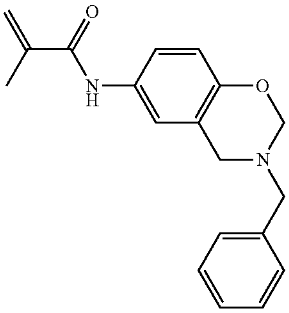

benzoxazine monomer 38

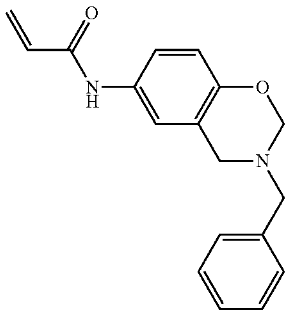

benzoxazine monomer 39

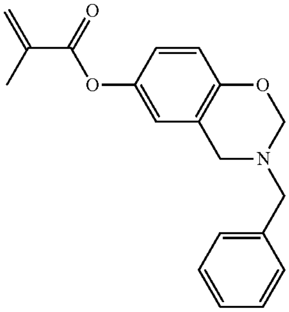

benzoxazine monomer 40

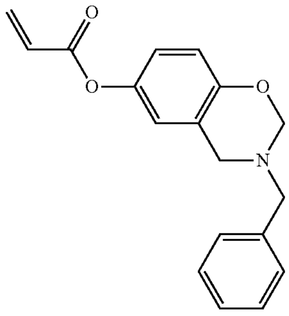

In a preferred embodiment, the alkali soluble resin according to the present invention further comprises a monomeric unit including a sulphonamide group. The monomeric unit containing a sulfonamide group is preferably a monomeric unit comprising a sulphonamide group represented by $—NR^j—SO_2—$, $—SO_2—NR^k—$ wherein $R^j$ and $R^k$ each independently represent hydrogen, an optionally substituted alkyl, alkanoyl, alkenyl, alkynyl, cycloalkyl, heterocyclic, aryl, heteroaryl, aralkyl, heteroaralkyl group or combinations thereof.

In a more preferred embodiment the monomeric unit containing a sulfonamide group is derived from the monomer according to structure (VIII):

(VIII)

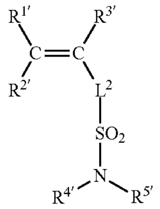

wherein $R^{1'}$, $R^{2'}$ and $R^{3'}$ independently represent hydrogen or an alkyl group such as methyl, ethyl or propyl; preferably $R^{3'}$ is hydrogen or methyl; preferably $R^{1'}$ and $R^{2'}$ are hydrogen;

$L^2$ represents a divalent linking group;

$R^{4'}$ and $R^{5'}$ represent hydrogen, an optionally substituted alkyl group such as methyl, ethyl, propyl, isopropyl, . . . , a cycloalkyl such as cyclopentane, cyclohexane, 1,3-dimethylcyclohexane, an alkenyl, alkynyl, alkaryl or aralkyl group, an aryl group such as benzene, naphthalene or antracene, or a heteroaryl aryl group such as furan, thiophene, pyrrole, pyrazole, imidazole, 1,2,3-triazole, 1,2,4-triazole, tetrazole, oxazole, isoxazole, triazole, isothiazole, thiadiazole, oxadiazole, pyridine, pyridazine, pyrimidine, pyrazine, 1,3,5-triazine, 1,2,4-triazine or 1,2,3-triazine, benzofuran, benzothiophene, indole, indazole, benzoxazole, quinoline, quinazoline, benzimidazole or benztriazole.

Preferably, the linking group $L^2$ represents an alkylene, arylene, heteroaxylene, —O—, —CO—, —CO—O—, —O—CO—, —CS—, —O— $(CH_2)_k$—, —$CH_2)_k$—O—, —$(CH_2)_k$—O—CO—, —O—CO—$(CH_2)_k$—, —$(CH_2)_k$—O—CO—$(CH_2)_l$—, —$(CH_2)_k$—COO—, —CO—O—$(CH_2)_k$—, —$(CH_2)_k$—COO—$(CH_2)_l$—, —$(CH_2)_k$—NH—, —NH—$(CH_2)_k$—, —$(CH_2)_k$—CONH—, —$(CH_2)_k$—CONH—$SO_2$—, —NH—$(CH_2)_k$—O—$(CH_2)_l$—, —CO—$(CH_2)_k$—, —$(CH_2)_k$—CO—, —CO—NH—, —NH—CO—, —NH—CO—O—, —O—CO—NH, —$(CH_2)_k$—CO—NH—, —NH—CO—$(CH_2)_k$—, —NH—CO—NH—, —NH—CS—NH—, or combinations thereof.

The optional substituents may be selected from an alkyl, cycloalkyl, alkenyl or cycle alkenyl group, an aryl or heteroaryl group, halogen, an alkylamine, an alkylaryl or arylalkyl group, an alkoxy or aryloxy group, a thio alkyl, thio aryl or thio heteroaryl group, a hydroxyl group, —SH, a carboxylic acid group or an alkyl ester thereof, a sulphonic acid group or an alkyl ester thereof, a phosphonic acid group or an alkyl ester thereof, a phosphoric acid group or an alkyl ester thereof, an amino group, a sulphonamide group, an amide group, a nitro group, a nitrile group a halogen or a combination of at least two of these groups, including at least one of these groups which is further substituted by one of these groups.

Further suitable examples of sulfonamide polymers and/or their method of preparation are disclosed in EP 933 682, EP 982 123, EP 1 072 432, WO 99/63407 and EP 1 400 351. Without being limited thereto, typical sulfonamide monomeric units are given below as monomers:

Sulfonamide monomer-1

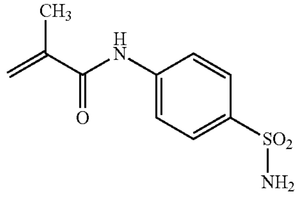

Sulfonamide monomer-2

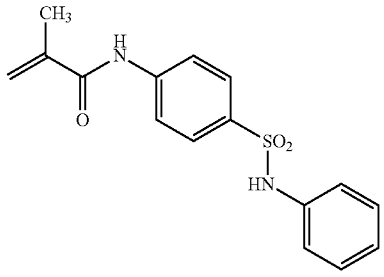

Sulfonamide monomer-3

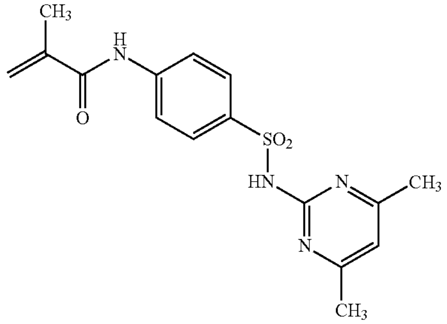

Sulfonamide monomer-4

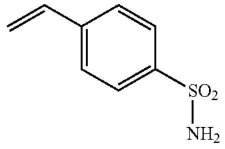

Sulfonamide monomer-5

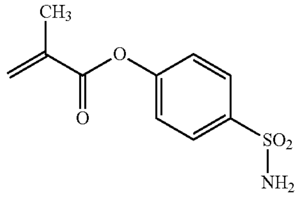

Sulfonamide monomer-6

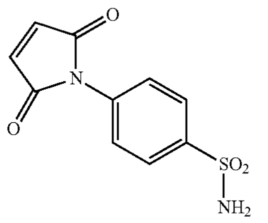

-continued

Sulfonamide monomer-7

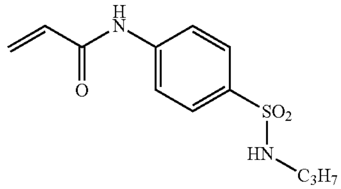

Sulfonamide monomer-8

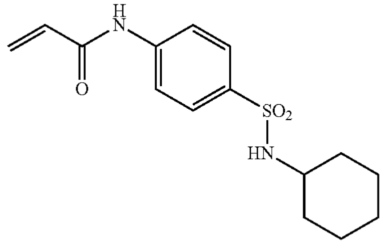

Sulfonamide monomer-9

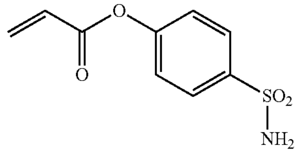

Sulfonamide monomer-10

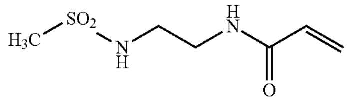

Sulfonamide monomer-11

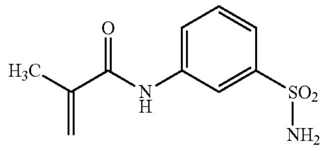

Sulfonamide monomer-12

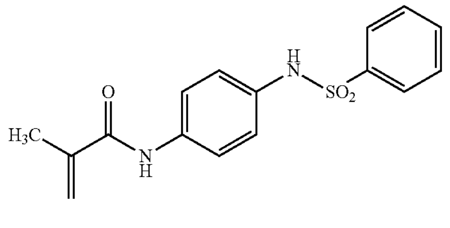

The alkali soluble resin according to the present invention may further comprise one or more other monomeric units, preferably selected from an acrylate or methacrylate e.g. an alkyl or aryl (meth)acrylate such as methyl (meth)acrylate, ethyl (meth)acrylate, butyl (meth)acrylate, benzyl (meth) acrylate, 2-phenylethyl (meth)acrylate, hydroxylethyl (meth) acrylate, phenyl (meth)acrylate or N-(4-methylpyridyl) (meth)acrylate; (meth)acrylic acid; a (meth)acrylamide e.g. (meth)acrylamide or a N-alkyl or N-aryl (meth)acrylamide such as N-methyl (meth)acrylamide, N-ethyl (meth)acrylamide, N-phenyl (meth)acrylamide, N-benzyl (meth)acrylamide, N-methylol (meth)acrylamide, N-(4-hydroxyphenyl) (meth)acrylamide; (meth)acrylonitrile; styrene; a substituted styrene such as 2-, 3- or 4-hydroxy-styrene, 4-benzoic acid-styrene; a vinylpyridine such as 2-vinylpyridine, 3-vinylpyridine, 4-vinylpyridine; a substituted vinylpyridine such as 4-methyl-2-vinylpyridine; vinyl acetate, optionally the copolymerised vinyl acetate monomeric units are at least partially hydrolysed, forming an alcohol group, and/or at least partially reacted by an aldehyde compound such as formaldehyde or butyraldehyde, forming an acetal or butyral group; vinyl alcohol; vinyl acetal; vinyl butyral; a vinyl ether such as methyl vinyl ether; vinyl amide; a N-alkyl vinyl amide such as N-methyl vinyl amide, caprolactame, vinyl pyrrolydone; maleic anhydride, a maleimide e.g. maleimide or a N-alkyl or N-aryl maleimide such as N-benzyl maleimide.

In a preferred embodiment, the alkali soluble resin further comprises monomeric units selected from a (meth)acrylamide such as (meth)acrylamide, phenyl (meth)acrylamide and methylol (meth)acrylamide; (meth)acrylic acid; styrene; maleic anhydride; a maleimide e.g. maleimide or a N-alkyl or N-aryl maleimide such as N-benzyl maleimide, (meth)acrylates such as methyl (meth)acrylate, phenyl(meth)acrylate, hydroxyethyl (meth)acrylate or benzyl (meth)acrylate.

The molar percentage of monomeric units according to structures (III), (V) and/or (VII) in the alkali soluble resin is preferably between 0.5 and 10 mol %, more preferably between 0.8 and 5 mol % and most preferably between 1 and 2.5 mol %. In the preferred embodiment where the alkali soluble resin comprises the sulfonamide monomer, the molar percentage of the sulfonamide monomer in the alkali soluble resin is preferably between 50 and 80 mol %, more preferably between 55 and 75 mol % and most preferably between 60 and 70 mol %. The alkali soluble polymer of the present invention has preferably a molecular weight ranging for $M_n$, i.e. number average molecular weight, between 10000 and 500000, more preferably between 15000 and 250000, most preferably between 20000 and 200000, and for $M_w$, i.e. weight average molecular weight, between 10000 and 1000000, more preferably between 50000 and 800000, most preferably between 60000 and 600000. These molecular weights are determined by the method as described in the Examples.

The amount of alkali soluble binder according to the present invention in the coating is preferably above 25% wt, more preferably above 50% wt and most preferably above 75% wt relative to the total weight of all ingredients in the coating. Alternatively, the alkali soluble binder according to the present invention in the coating is preferably above 80% wt, more preferably above 85% wt and most preferably above 90% wt.

Optionally, the coating may further comprise one or more binders selected from hydrophilic binders such as homopolymers and copolymers of vinyl alcohol, (meth)acrylamide, methylol (meth)acrylamide, (meth)acrylic acid, hydroxyethyl (meth)acrylate, maleic anhydride/vinylmethylether copolymers, copolymers of (meth)acrylic acid or vinylalcohol with styrene sulphonic acid; hydrophobic binders such as phenolic resins (e.g. novolac, resoles or polyvinyl phenols); chemically modified phenolic resins or polymers containing a carboxyl group, a nitrile group or a maleimide group as described in DE 4 007 428, DE 4 027 301 and DE 4 445 820; polymers having an active imide group such as $—SO_2—NH—CO—R^h$, $—SO_2—NH—SO_2—R^h$ or $—CO—NH—SO_2—R^h$ wherein $R^h$ represents an optionally substituted hydrocarbon group such as an optionally substituted alkyl, aryl, alkaryl, aralkyl or heteroaryl group; polymers comprising a N-benzyl-maleimide monomeric unit as described in EP 933 682, EP 894 622 (page 3 line 16 to page 6 line 30), EP 982 123 (page 3 line 56 to page 51 line 5), EP 1 072 432 (page 4 line 21 to page 10 line 29) and WO 99/63407 (page 4 line 13 to page 9 line 37); polymers having an acidic group which can be selected from polycondensates and polymers having free phenolic hydroxyl groups, as obtained, for example, by reacting phenol, resorcinol, a cresol, a xylenol or a trimethylphenol with aldehydes, especially formaldehyde, or ketones; condensates of sulfamoyl- or carbamoyl-substituted aromatics and aldehydes or ketones; polymers of bismethylol-substituted ureas, vinyl ethers, vinyl alcohols, vinyl acetals or vinylamides and polymers of phenylacrylates and copolymers of hydroxy-phenylmaleimides; polymers having units of vinylaromatics, N-aryl(meth)acrylamides or aryl (meth) acrylates containing optionally one or more carboxyl groups, phenolic hydroxyl groups, sulfamoyl groups or carbamoyl groups such as polymers having units of 2-hydroxyphenyl (meth)acrylate, of N-(4-hydroxyphenyl)(meth)acrylamide, of N-(4-sulfamoylphenyl)(meth)acrylamide, of N-(4-hydroxy-3,5-dimethylbenzyl)(meth)acrylamide, or 4-hydroxystyrene or of hydroxyphenylmaleimide; vinylaromatics, methyl (meth)acrylate, phenyl(meth)acrylate, benzyl (meth) acrylate, methacrylamide or acrylonitrile.

In a second preferred embodiment of the present invention, the compound including a benzoxazine group is a compound according to structures (I) and/or (II):

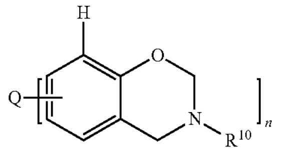

(I)

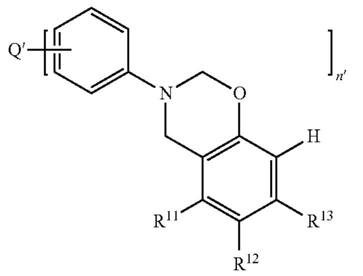

(II)

wherein

Q and Q' independently represent an optionally substituted alkylidene or hetero-alkylidene group, an optionally substituted nitrogen, an oxygen, a sulphone, a sulphoxide, a carbonyl, a thioether, a thiol or a phosphine oxide group;

$R^{10}$ represents hydrogen or an optionally substituted alkyl, alicyclic alkyl, aralkyl, aryl or heteroaryl group;

$R^{11}$, $R^{12}$ and $R^{13}$ independently represent hydrogen, a halogen or an optionally substituted alkyl, alicyclic alkyl, aralkyl, aryl or heteroaryl group; and n and n' independently represent an integer comprised between 1 and 4.

The optional substituents on the substituents $R^{10}$ to $R^{13}$ of structures (I) and (II) may be selected from an alkyl, cycloalkyl, an aryl or heteroaryl group, an alkylaryl or arylalkyl group, an alkoxy or aryloxy group, a thio alkyl, thio aryl or thio heteroaryl group, a hydroxyl group, —SH, a carboxylic acid group or an alkyl ester thereof, a sulphonic acid group or an alkyl ester thereof, a phosphoric acid group or an alkyl ester thereof, a phosphoric acid group or an alkyl ester thereof, an amino group, a sulphonamide group, an amide group, a nitro group, a nitrile group a halogen or a combination of at least two of these groups, including at least one of these groups which is further substituted by one of these groups and/or combination thereof.

In a preferred embodiment, the benzoxazine compound according to structures (I) and/or (II) is multifunctional, i.e. n or n'≥2. The multifunctional benzoxazine compound may be based on bis-aniline derivatives where n' is equal to 2.

Preferred benzoxazine compounds according to structures (I) and/or (II) are based on bis-phenol-A, bis-phenol-F or bis-aniline derivatives and can for example be synthesized as follows:

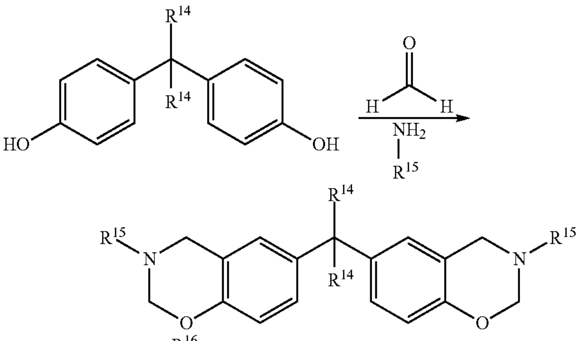

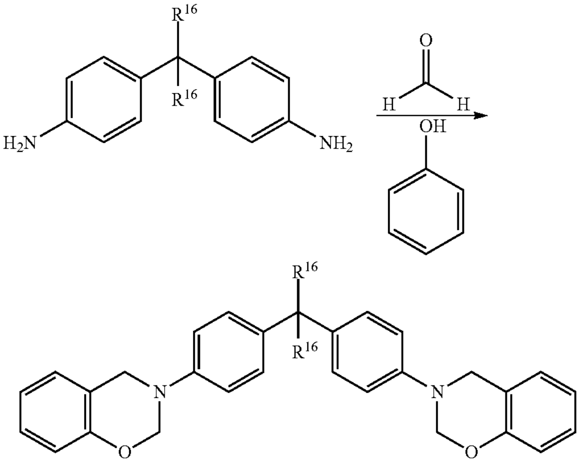

wherein $R^{14}$ and $R^{16}$ independently represent hydrogen or a methyl group;

$R^{15}$ represents hydrogen, an optionally substituted straight, branched or cyclic alkyl group such as methyl, ethyl, propyl, isopropyl, butyl, tertiary butyl, pentyl, cyclopentyl or cyclohexyl group alkyl, an optionally substituted aralkyl or hetero-aralkyl group, an optionally substituted (di)alkylamine group, an optionally substituted aryl group such as a phenyl, a benzyl, a tolyl, an ortho- meta- or para-xylyl, naphtalenic, an anthracenic, a phenanthrenic or a carbazoyl group, or an optionally substituted heteroaryl group such as a pyridyl, pyrimidyl, pyrazoyl or pyridazyl group.

The benzoxazine compounds according to structures (I) and/or (II) can further be synthesized according to for example the method described by Ding and Ishida in *Journal of Polymer Science: Part A: Polymer Chemistry,* 32, 1121-1129 (1994). Some of these benzoxazine compounds are commercially available and are usually available as a mixture of partially reacted compound, i.e. oligomeric species that are produced by the thermal autopolymerization via ring-opening.

The level of the compound including a benzoxazine group according to structure (I) and/or (II) in the coating of the printing plate preferably ranges between 0.01 $g/m^2$ to 1 $g/m^2$, more preferably between 0.02 $g/m^2$ to 0.5 $g/m^2$ and most preferably between 0.02 $g/m^2$ to 0.2 $g/m^2$.

The coating of the printing plate comprising the compound according to structure (I) and/or (II) preferably further comprises one or more binders selected from the alkali soluble resin according to the present invention, hydrophilic binders such as homopolymers and copolymers of vinyl alcohol, (meth)acrylamide, methylol (meth)acrylamide, (meth) acrylic acid, hydroxyethyl (meth)acrylate, maleic anhydride/vinylmethylether copolymers, copolymers of (meth)acrylic acid or vinylalcohol with styrene sulphonic acid; hydrophobic binders such as phenolic resins (e.g. novolac, resoles or polyvinyl phenols); chemically modified phenolic resins or polymers containing a carboxyl group, a nitrile group or a maleimide group as described in DE 4 007 428, DE 4 027 301 and DE 4 445 820; polymers having an active imide group such as —$SO_2$—NH—CO—$R^h$, —$SO_2$—NH—$SO_2$—$R^h$ or —CO—NH—$SO_2$—$R^h$ wherein $R^h$ represents an optionally substituted hydrocarbon group such as an optionally substituted alkyl, aryl, alkaryl, aralkyl or heteroaryl group; polymers comprising a N-benzyl-maleimide monomeric unit as described in EP 933 682, EP 894 622 (page 3 line 16 to page 6 line 30), EP 982 123 (page 3 line 56 to page 51 line 5), EP 1 072 432 (page 4 line 21 to page 10 line 29) and WO 99/63407 (page 4 line 13 to page 9 line 37); polymers having an acidic group which can be selected from polycondensates and polymers having free phenolic hydroxyl groups, as obtained, for example, by reacting phenol, resorcinol, a cresol, a xylenol or a trimethylphenol with aldehydes, especially formaldehyde, or ketones; condensates of sulfamoyl- or carbamoyl-substituted aromatics and aldehydes or ketones; polymers of bismethylol-substituted ureas, vinyl ethers, vinyl alcohols, vinyl acetals or vinylamides and polymers of phenylacrylates and copolymers of hydroxy-phenylmaleimides; sulfonamides (as described above); polymers having units of vinylaromatics, N-aryl(meth)acrylamides or aryl (meth)acrylates containing optionally one or more carboxyl groups, phenolic hydroxyl groups, sulfamoyl groups or carbamoyl groups such as polymers having units of 2-hydroxyphenyl (meth)acrylate, of N-(4-hydroxyphenyl)(meth)acrylamide, of N-(4-sulfamoylphenyl)(meth)acrylamide, of N-(4-hydroxy-3,5-dimethylbenzyl)(meth)acrylamide, or 4-hydroxystyrene or of hydroxyphenylmaleimide; vinylaromatics, methyl (meth)acrylate, phenyl(meth)acrylate, benzyl (meth)acrylate, methacrylamide or acrylonitrile.

Preferably, the coating including the compound according to structure (I) and/or (II) further comprises one or more binders selected from homopolymers and copolymers of vinyl alcohol, (meth)acrylamide, methylol (meth)acrylamide, (meth)acrylic acid, hydroxyethyl (meth)acrylate, maleic anhydride/vinylmethylether copolymers, styrenic resins, (meth)acrylonitrile, phenolic resins or sulfonamide binders as described above. Most preferred, the coating includes a sulfonamide binder as defined in detail above.

The coating may comprise more than one layer. One or more of the compound(s) including the benzoxazine group according to the present invention—i.e. the alkali soluble resin as described above and/or the structures (I) and/or (II)—may be present only in one layer or in more than one layer. Preferably, the coating comprises at least two layers.

In a preferred embodiment, the coating comprises a first layer comprising the compound(s) including the benzoxazine group—further referred to as the first layer, and a second layer comprising a phenolic resin located above said first layer—further referred to as the second layer. First layer means that the layer is, compared to the second layer, located closer to the lithographic support. One or more of the compound(s) including the benzoxazine group present in the first layer may be also present in the second layer but is (are) preferably only present in the first layer. In this preferred embodiment wherein the coating comprises two layers, the first layer preferably contains, besides the compound containing the benzoxazine group, a sulfonamide binder as described above and/or other binders. The second layer comprising the phenolic resin is an alkaline soluble oleophilic resin. The phenolic resin is preferably a novolac, a resol or a polyvinylphenolic resin; novolac is more preferred. Typical examples of such polymers are described in DE-A-4007428, DE-A-4027301 and DE-A-4445820. Other preferred polymers are phenolic resins wherein the phenyl group or the hydroxy group of the phenolic monomeric unit are chemically modified with an organic substituent as described in EP 894 622, EP 901 902, EP 933 682, WO99/63407, EP 934 822, EP 1 072 432, U.S. Pat. No. 5,641,608, EP 982 123, WO99/01795, WO04/035310, WO04/035686, WO04/035645, WO04/035687 or EP 1 506 858.

The novolac resin or resol resin may be prepared by polycondensation of at least one member selected from aromatic hydrocarbons such as phenol, o-cresol, p-cresol, m-cresol, 2,5-xylenol, 3,5-xylenol, resorcinol, pyrogallol, bisphenol, bisphenol A, trisphenol, o-ethylphenol, p-etylphenol, propylphenol, n-butylphenol, t-butylphenol, 1-naphtol and 2-naphtol, with at least one aldehyde or ketone selected from aldehydes such as formaldehyde, glyoxal, acetoaldehyde, propionaldehyde, benzaldehyde and furfural and ketones such as acetone, methyl ethyl ketone and methyl isobutyl ketone, in the presence of an acid catalyst. Instead of formaldehyde and acetaldehyde, paraformaldehyde and paraldehyde may, respectively, be used.

The weight average molecular weight, measured by gel permeation chromatography using universal calibration and polystyrene standards, of the novolac resin is preferably from 500 to 150,000 g/mol, more preferably from 1,500 to 50,000 g/mol.

The poly(vinylphenol) resin may also be a polymer of one or more hydroxy-phenyl containing monomers such as hydroxystyrenes or hydroxy-phenyl (meth)acrylates. Examples of such hydroxystyrenes are o-hydroxystyrene, m-hydroxystyrene, p-hydroxystyrene, 2-(o-hydroxyphenyl) propylene, 2-(m-hydroxyphenyl)propylene and 2-(p-hydroxyphenyl)propylene. Such a hydroxystyrene may have a substituent such as chlorine, bromine, iodine, fluorine or a $C_{1-4}$ alkyl group, on its aromatic ring. An example of such hydroxy-phenyl (meth)acrylate is 2-hydroxy-phenyl methacrylate.

The poly(vinylphenol) resin may usually be prepared by polymerizing one or more hydroxy-phenyl containing monomer in the presence of a radical initiator or a cationic polymerization initiator. The poly(vinylphenol) resin may also be prepared by copolymerizing one or more of these hydroxy-phenyl containing monomers with other monomeric compounds such as acrylate monomers, methacrylate monomers, acrylamide monomers, methacrylamide monomers, vinyl monomers, aromatic vinyl monomers or diene monomers.

The weight average molecular weight, measured by gel permeation chromatography using universal calibration and polystyrene standards, of the poly(vinylphenol) resin is preferably from 1.000 to 200,000 g/mol, more preferably from 1,500 to 50,000 g/mol.

Examples of suitable phenolic resins are:

RESIN-01: ALNOVOL SPN452 is a solution of a novolac resin, 40% wt in Dowanol PM, obtained from CLARIANT GmbH. Dowanol PM consists of 1-methoxy-2-propanol (>99.5%) and 2-methoxy-1-propanol (<0.5%).

RESIN-02: ALNOVOL SPN400 is a solution of a novolac resin, 44% wt in Dowanol PMA, obtained from CLARIANT GmbH. Dowanol. PMA consists of 2-methoxy-1-methylethylacetate.

RESIN-03: ALNOVOL HPN100 a novolac resin obtained from CLARIANT GmbH.

RESIN-04: DURITE PD443 is a novolac resin obtained from BORDEN CHEM. INC.

RESIN-05: DURITE SD423A is a novolac resin obtained from BORDEN CHEM. INC.

RESIN-06: DURITE SD126A is a novolac resin obtained from BORDEN CHEM. INC.

RESIN-07: BAKELITE 6866LB02 is a novolac resin obtained from BAKELITE AG.

RESIN-08: BAKELITE 6866LB03 is a novolac resin obtained from BAKELITE AG.

RESIN-09: KR 400/8 is a novolac resin obtained from KOYO CHEMICALS INC.

RESIN-10: HRJ 1085 is a novolac resin obtained from SCHNECTADY INTERNATIONAL INC.

RESIN-11: HRJ 2606 is a phenol novolac resin obtained from SCHNECTADY INTERNATIONAL INC.

RESIN-12: LYNCUR CMM is a copolymer of 4-hydroxystyrene and methyl methacrylate obtained from SIBER HEGNER.

The dissolution behavior of the two-layer coating—i.e. the coating comprising the first layer, the second layer and/or optional other layer—in the developer can be fine-tuned by optional solubility regulating components. More particularly, development accelerators and development inhibitors can be used. These ingredients are preferably added to the second layer.

Development accelerators are compounds which act as dissolution promoters because they are capable of increasing the dissolution rate of the coating, developer resistance means, also called development inhibitors, i.e. one or more ingredients which are capable of delaying the dissolution of the unexposed areas during processing. The dissolution inhibiting effect is preferably reversed by heating, so that the dissolution of the exposed areas is not substantially delayed and a large dissolution differential between exposed and unexposed areas can thereby be obtained. The compounds described in e.g. EP 823 327 and WO 97/39894 are believed to act as dissolution inhibitors due to interaction, e.g. by hydrogen bridge formation, with the alkali-soluble resin(s) in the coating. Inhibitors of this type typically comprise at least one hydrogen bridge forming group such as nitrogen atoms, onium groups, carbonyl (—CO—), sulfinyl (—SO—) or sulfonyl (—$SO_2$—) groups and a large hydrophobic moiety such as one or more aromatic rings. Some of the compounds mentioned below, e.g. infrared dyes such as cyanines and contrast dyes such as quaternized triarylmethane dyes can also act as a dissolution inhibitor.

Other suitable inhibitors improve the developer resistance because they delay the penetration of the aqueous alkaline developer into the coating. Such compounds can be present in the imaging layer and/or in an optional second layer as described in e.g. EP 950 518, and/or in an optional development barrier layer on top of said layer as described in e.g. EP 864 420, EP 950 517, WO 99/21725 and WO 01/45958. In the latter embodiment, the solubility of the barrier layer in the developer or the penetrability of the barrier layer by the developer can be increased by exposure to heat or infrared light.

Preferred examples of inhibitors which delay the penetration of the aqueous alkaline developer into the coating include the following:

(a) A polymeric material which is insoluble in or impenetrable by the developer, e.g. a hydrophobic or water-repellent polymer or copolymer such as acrylic polymers, polystyrene, styrene-acrylic copolymers, polyesters, polyamides, polyureas, polyurethanes, nitrocellulosics and epoxy resins; or polymers comprising siloxane (silicones) and/or perfluoroalkyl units.

(b) Bifunctional compounds such as surfactants comprising a polar group and a hydrophobic group such as a long chain hydrocarbon group, a poly- or oligosiloxane and/or a perfluorinated hydrocarbon group. A typical example is Megafac F-177, a perfluorinated surfactant available from Dainippon Ink & Chemicals, Inc. A suitable amount of such compounds is between 10 and 100 $mg/m^2$, more preferably between 50 and 90 $mg/m^2$.

(c) Bifunctional block-copolymers comprising a polar block such as a poly- or oligo(alkylene oxide) and a hydrophobic block such as a long chain hydrocarbon group, a poly- or oligosiloxane and/or a perfluorinated hydrocarbon group. A suitable amount of such compounds is between 0.5 and 25 $mg/m^2$, preferably between 0.5 and 15 $mg/m^2$ and most preferably between 0.5 and 10 $mg/m^2$. A suitable copolymer comprises about 15 to 25 siloxane units and 50 to 70 alkyleneoxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Said poly- or oligosiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the polymer or oligomer is at least 2, preferably at least 10, more preferably at least 20. It may be less than 100, preferably less than 60.

It is believed that during coating and drying, the above mentioned inhibitor of type (b) and (c) tends to position itself, due to its bifunctional structure, at the interface between the coating and air and thereby forms a separate top layer even when applied as an ingredient of the coating solution of the first and/or of the second layer. Simultaneously, the surfactants also act as a spreading agent which improves the coating quality. The separate top layer thus formed seems to be capable of acting as the above mentioned barrier layer which delays the penetration of the developer into the coating.

Alternatively, the inhibitor of type (a) to (c) can be applied in a separate solution, coated on top of the second and/or optional other layers of the coating. In that embodiment, it may be advantageous to use a solvent in the separate solution that is not capable of dissolving the ingredients present in the other layers so that a highly concentrated water-repellent or hydrophobic phase is obtained at the top of the coating which is capable of acting as the above mentioned development barrier layer.

The coating of the heat-sensitive printing plate precursors described above preferably also contains an infrared light absorbing dye or pigment which may be present in the first layer, the second layer and/or in an optional other layer. Preferred IR absorbing dyes are cyanine dyes, merocyanine dyes, indoaniline dyes, oxonol dyes, pyrilium dyes and squarilium dyes. Examples of suitable IR dyes are described in e.g. EP-As 823327, 978376, 1029667, 1053868, 1093934; WO 97/39894 and 00/29214. A preferred compound is the following cyanine dye:

IR-1

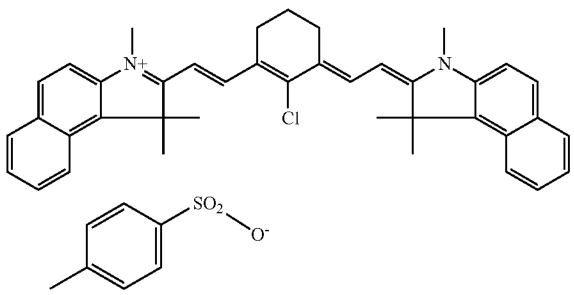

The concentration of the IR-dye in the coating is preferably between 0.25 and 15.0% wt, more preferably between 0.5 and 10.0% wt, most preferably between 1.0 and 7.5% wt relative to the coating as a whole.

The coating may further comprise one or more colorant(s) such as dyes or pigments which provide a visible color to the coating and which remain in the coating at the image areas which are not removed during the processing step. Thereby a visible image is formed and examination of the lithographic image on the developed printing plate becomes feasible. Such dyes are often called contrast dyes or indicator dyes. Preferably, the dye has a blue color and an absorption maximum in the wavelength range between 600 nm and 750 nm. Typical examples of such contrast dyes are the amino-substituted tri- or diarylmethane dyes, e.g. crystal violet, methyl violet, victoria pure blue, flexoblau 630, basonylblau 640, auramine and malachite green. Also the dyes which are discussed in depth in EP-A 400,706 are suitable contrast dyes. Dyes which, combined with specific additives, only slightly color the coating but which become intensively colored after exposure, as described in for example WO2006/005688 may also be used as colorants.

Optionally, the coating may further contain additional ingredients. These ingredients may be present in the first, second or in an optional other layer. For example, polymer particles such as matting agents and spacers, surfactants such as perfluoro-surfactants, silicon or titanium dioxide particles, colorants, metal complexing agents are well-known components of lithographic coatings.

To protect the surface of the coating, in particular from mechanical damage, a protective layer may optionally be applied on top of the coating. The protective layer generally comprises at least one water-soluble polymeric binder, such as polyvinyl alcohol, polyvinylpyrrolidone, partially hydrolyzed polyvinyl acetates, gelatin, carbohydrates or hydroxyethylcellulose. The protective layer may contain small amounts, i.e. less then 5% by weight, of organic solvents. The thickness of the protective layer is not particularly limited but preferably is up to 5.0 μm, more preferably from 0.05 to 3.0 μm, particularly preferably from 0.10 to 1.0 μm.

The coating may further contain other additional layer(s) such as for example an adhesion-improving layer located between the first layer and the support.

The lithographic printing plate used in the present invention comprises a support which has a hydrophilic surface or which is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate comprising an aluminum foil and a plastic layer, e.g. polyester film.

A particularly preferred lithographic support is an electrochemically grained and anodized aluminum support. The aluminum support has usually a thickness of about 0.1-0.6 mm. However, this thickness can be changed appropriately depending on the size of the printing plate used and/or the size of the plate-setters on which the printing plate precursors are exposed. The aluminium is preferably grained by electrochemical graining, and anodized by means of anodizing techniques employing phosphoric acid or a sulphuric acid/phosphoric acid mixture. Methods of both graining and anodization of aluminum are very well known in the art.

By graining (or roughening) the aluminum support, both the adhesion of the printing image and the wetting characteristics of the non-image areas are improved. By varying the type and/or concentration of the electrolyte and the applied voltage in the graining step, different type of grains can be obtained. The surface roughness is often expressed as arithmetical mean center-line roughness Ra (ISO 4287/1 or DIN 4762) and may vary between 0.05 and 1.5 μm. The aluminum substrate of the current invention has preferably an Ra value below 0.45 μm, more preferably below 0.40 μm, even more preferably below 0.30 μm and most preferably below 0.25 μm. The lower limit of the Ra value is preferably about 0.1 μm. More details concerning the preferred Ra values of the surface of the grained and anodized aluminum support are described in EP 1 356 926.

By anodising the aluminum support, its abrasion resistance and hydrophilic nature are improved. The microstructure as well as the thickness of the $Al_2O_3$ layer are determined by the anodising step, the anodic weight ($g/m^2$ $Al_2O_3$ formed on the aluminium surface) varies between 1 and 8 $g/m^2$. The anodic weight is preferably 3 $g/m^2$, more preferably 3.5 $g/m^2$ and most preferably 4.0 $g/m^2$.

The grained and anodized aluminum support may be subject to a so-called post-anodic treatment to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde.

Another useful post-anodic treatment may be carried out with a solution of polyacrylic acid or a polymer comprising at least 30 mol % of acrylic acid monomeric units, e.g. GLASCOL E15, a polyacrylic acid, commercially available from Ciba Speciality Chemicals.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm. More details of preferred embodiments of the base layer can be found in e.g. EP-A 1 025 992.

Any coating method can be used for applying two or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimized. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and WO/04030923, WO/04030924, WO/04030925.

The heat-sensitive plate precursor can be image-wise exposed directly with heat, e.g. by means of a thermal head, or indirectly by infrared light, preferably near infrared light. The infrared light is preferably converted into heat by an IR light absorbing compound as discussed above. The printing plate precursor is positive working and relies on heat-induced solubilization of the binder of the present invention. The binder is preferably a polymer that is soluble in an aqueous developer, more preferably an aqueous alkaline developing solution with a pH between 7.5 and 14.

The printing plate precursor can be exposed to infrared light by means of e.g. LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser. The required laser power depends on the sensitivity of the plate precursor, the pixel dwell time of the laser beam, which is determined by the spot diameter (typical value of modern plate-setters at $1/e^2$ of maximum intensity: 5-25 μm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) platesetters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec. An XTD platesetter equipped with one or more laser diodes emitting in the wavelength range between 750 and 850 nm is an especially preferred embodiment for the method of the present invention.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

Preferred lithographic printing plate precursors according to the present invention produce a useful lithographic image upon image-wise exposure with IR-light having an energy density, measured at the surface of said precursor, of 200 $mJ/cm^2$ or less, more preferably of 180 $mJ/cm^2$ or less, most preferably of 160 $mJ/cm^2$ or less. With a useful lithographic image on the printing plate, 2% dots (at 200 lpi) are perfectly visible on at least 1000 prints on paper.

The printing plate precursor, after exposure, is developed off press by means of a suitable processing liquid. In the development step, the exposed areas of the image-recording layer are at least partially removed without essentially removing the non-exposed areas, i.e. without affecting the exposed areas to an extent that renders the ink-acceptance of the exposed areas unacceptable. The processing liquid can be applied to the plate e.g. by rubbing with an impregnated pad, by dipping, immersing, (spin-)coating, spraying, pouring-on, either by hand or in an automatic processing apparatus. The treatment with a processing liquid may be combined with mechanical rubbing, e.g. by a rotating brush. The developed plate precursor can, if required, be post-treated with rinse water, a suitable correcting agent or preservative as known in the art. During the development step, any water-soluble protective layer present is preferably also removed. The development is preferably carried out at temperatures of from 20 to 40° C. in automated processing units as customary in the art. More details concerning the development step can be found in for example EP 1 614 538, EP 1 614 539, EP 1 614 540 and WO/2004/071767.

The developing solution preferably contains a buffer such as for example a silicate-based buffer or a phosphate buffer. The concentration of the buffer in the developer preferably ranges between 3 to 14% wt. Silicate-based developers which have a ratio of silicon dioxide to alkali metal oxide of at least 1 are advantageous because they ensure that the alumina layer (if present) of the substrate is not damaged. Preferred alkali metal oxides include $Na_2O$ and $K_2O$, and mixtures thereof. A particularly preferred silicate-based developer solution is a developer solution comprising sodium or potassium metasilicate, i.e. a silicate where the ratio of silicon dioxide to alkali metal oxide is 1.

The developing solution may optionally contain further components as known in the art: other buffer substances, chelating agents, surfactants, complexes, inorganic salts, inorganic alkaline agents, organic alkaline agents, antifoaming agents, organic solvents in small amounts i.e. preferably less than 10% wt and more preferably less than 5% wt, non-reducing sugars, glycosides, dyes and/or hydrotropic agents. These components may be used alone or in combination.

To ensure a stable processing with the developer solution for a prolonged time, it is particularly important to control the concentration of the ingredients in the developer. Therefore a replenishing solution, hereinafter also referred to as replenisher, is often added to the developing solution. More than one replenishing solution containing different ingredients and/or different amounts of the ingredients may be added to the developing solution. Alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. It is advantageous that the (co)polymer of the present invention is present in the replenisher(s); preferably at a concentration of at least 0.5 g/l, more preferably in a concentration ranging between 1 and 50 g/1 most preferably between 2 and 30 g/l.

The replenishing solution has preferably a pH value of at least 10, more preferably of at least 11, most preferably of at least 12.

The development step may be followed by a rinsing step and/or a gumming step. A suitable gum solution which can be used is described in for example EP-A 1 342 568 and WO 2005/111727.

To increase the resistance of the finished printing plate and hence to extend its press-life capability (run length), the plate coating is preferably briefly heated to elevated temperatures ("baking"). The plate can be dried before baking or is dried during the baking process itself. During the baking step, the plate can be heated at a temperature which is higher than the glass transition temperature of the heat-sensitive coating, e.g. between 100° C. and 300° C. for a period of 15 seconds to 5 minutes. In a preferred embodiment, the baking temperature does not exceed 300° C. during the baking period. Baking can be done in conventional hot air ovens or by irradiation with lamps emitting in the infrared or ultraviolet spectrum, as e.g. described in EP 1 588 220 and EP 1 916 101. Both so-called static and dynamic baking ovens can be used. As a result of this baking step, the resistance of the printing plate to plate cleaners, correction agents and UV-curable printing inks increases. Such a thermal post-treatment is known in the art and is described, inter alia, in DE 1 447 963, GB 1 154 749 and EP 1 506 854.

According to the present invention there is also provided a method for making a positive-working lithographic printing plate comprising the steps of imagewise exposing the heat-sensitive lithographic printing plate precursor according to the present invention to heat and/or infrared light, followed by developing the imagewise exposed precursor with an aqueous alkaline developer so that the exposed areas are dissolved. The obtained precursor is preferably baked. Baking may be done by keeping the plate at a temperature between 200° C. and 300° C. during a period between 30 seconds and 2 minutes. The baking step may also be carried out as described in the previous paragraph.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

EXAMPLES

I. Synthesis

A. Synthesis of Benzoxazine Monomers.

The synthesis of the inventive benzoxazine monomers 1 to 40 follow the following reaction mechanism:

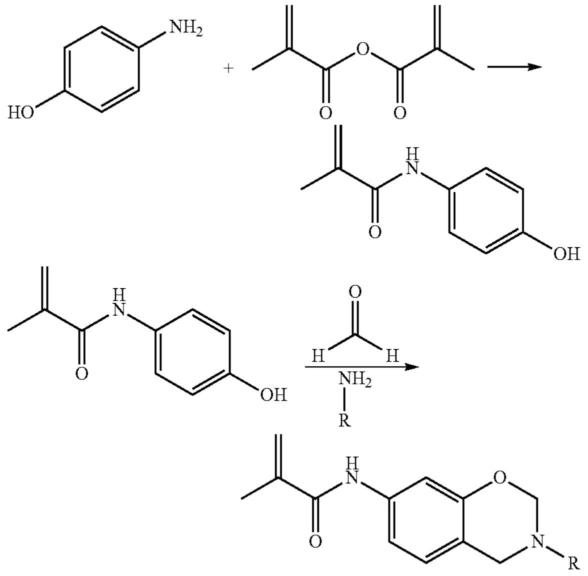

1. Synthesis of Benzoxazine Monomer-17.

5.9 g (0.072 mol) of formaldehyde solution in water, 3.6 g (0.036 mol) of cyclohexylamine and 0.3 g (0.0036) of triethylamine were stirred in 25 ml of 1,4-dioxane or ethyl acetate at 23° C. for 0.2 hours. The temperature was raised to 88° C. (reflux) and 3.2 g (0.018 mol) of N-p-hydroxyphenyl methacrylamide (commercially available from Wako Fine Chemicals Co.—CAS 19243-95-9) dissolved in 16 ml of 1,4-dioxane were added to the reaction mixture. The reaction mixture was stirred for 4 additional hours at 88° C. 2,6-di-tert-butyl-4-methylphenol (0.08 g, 0.0004 mol) was added to the mixture. Thin layer chromatography indicated the completion of the reaction without any further purification. The crude product was isolated by solvent evaporation at under reduced pressure: yield=82%. The purity of the light beige powder without recrystallization procedure was indicated by $^1H$ NMR: purity>99%.

2. Synthesis of benzoxazine monomers 1, 5, 9, 13, 21, 25, 29, 33 and 37.

The synthesis of the monomers 1, 5, 9, 13, 21, 25, 29, 33 and 37 follows the general procedure described above for the synthesis of monomer 17 by replacing cyclohexylamine by respectively the alkyl, aryl or alicyclic amines summarized in Table 1 below.

3. Synthesis of benzoxazine monomers 2, 6, 10, 14, 18, 22, 26, 30, 34 and 38.

The synthesis of the monomers 2, 6, 10, 14, 18, 22, 26, 30, 34 and 38 follows the general procedure described for the synthesis of monomer 17 by replacing N-p-hydroxyphenyl methacrylamide by N-p-hydroxyphenyl acrylamide (commercially available at Finechemie & Pharma Co. and at China Hallochem Pharma Co.) and by using the appropriate alkyl, aryl or alicyclic amines summarized in Table 1 below.

4. Synthesis of benzoxazine monomers 3, 7, 11, 15, 19, 23, 27, 31, 35 and 39.

The synthesis of the monomers 3, 7, 11, 15, 19, 23, 27, 31, 35 and 39 follows the general procedure described for the synthesis of monomer 17 by replacing N-p-hydroxyphenyl methacrylamide by p-hydroxyphenyl methacrylate (commercially available at Finechemie & Pharma Co. and at China Hallochem Pharma Co.) and by using the appropriate alkyl, aryl or alicyclic amines summarised in Table 1 below. p-Hydroxyphenyl methacrylate can be synthesized according to EP 1 970 367 A2.

5. Synthesis of benzoxazine monomers 4, 8, 12, 16, 20, 24, 28, 32, 36 and 40.

The synthesis of the monomers 4, 8, 12, 16, 20, 24, 28, 32, 36 and 40 follows the general procedure described for the synthesis of monomer 17 by replacing N-p-hydroxyphenyl methacrylamide by p-hydroxyphenyl acrylate and by using the appropriate alkyl, aryl or alicyclic amines summarised in Table 1 below. p-Hydroxyphenyl acrylate can be synthesized according to EP 1 970 367 A2.

TABLE 1 amines used in the synthesis of the inventive benzoxazine monomers.

| Benzoxazine monomer | amine |
|---|---|
| 1, 2, 3, 4 | 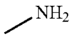 |
| 5, 6, 7, 8 | 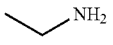 |
| 9, 10, 11, 12 | 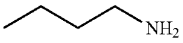 |
| 13, 14, 15, 16 | 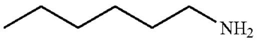 |
| 21, 22, 23, 24 | 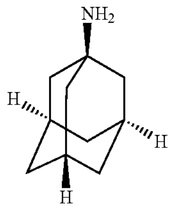 |
| 17, 18, 19, 20 | 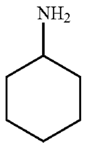 |
| 25, 26, 27, 28 | 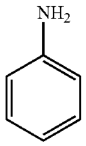 |
| 29, 30, 31, 32 | 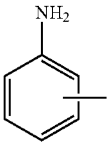 |
| 33, 34, 35, 36 | 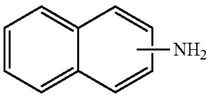 |

TABLE 1-continued amines used in the synthesis of the inventive benzoxazine monomers.

| Benzoxazine monomer | amine |
|---|---|
| 37, 38, 39, 40 | 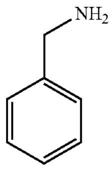 |

Further amines suitable for use in the synthesis of benzoxazine monomers are given in Table 2.

TABLE 2

| amines suitable for use in the synthesis of benzoxazine monomers. |
|---|
| 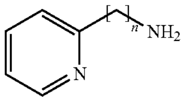 |
| 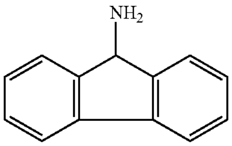 [SMILES: NC1c2ccccc2-c2ccccc21] |
| 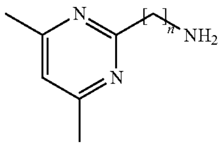 |
| 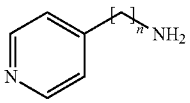 |
| 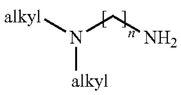 |

Tables 1 and 2 are not exhaustive and any optionally substituted alkyl, alicyclic alkyl or aryl compound optionally containing unsaturated bonds and bearing a primary or secondary amine functional group, are covered by the scope of the present invention. Compounds optionally containing unsaturated bonds and bearing a primary or secondary amine functional group including heterocycles, e.g. pyrimidine-derivatives, 2-pyridine or 4-pyridine, or basic functional groups like tertiary amines which may add basicity to the monomer and may enhance its alkaline solubility, are also of interest in this invention.

B. Synthesis of Benzoxazine Crosslinkers.

The benzoxazine crosslinkers 1, 2 and 3 (Table 3) are commercially available at Shikoku Chemicals Co. (Japan). They are delivered as a mixture of partially reacted compound, i.e. oligomeric species that are produced by the thermal autopolymerization via ring-opening.

TABLE 3

Structure of the benzoxazine crosslinkers.

| | Structure | Supplier | Composition |
|---|---|---|---|
| Crosslinker 1, B-m type* | 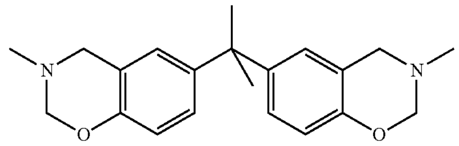 | Shikoku Chemicals Co. | Mixture of monomer and oligomer >60% monomer content |
| Crosslinker 2, F-a type* | 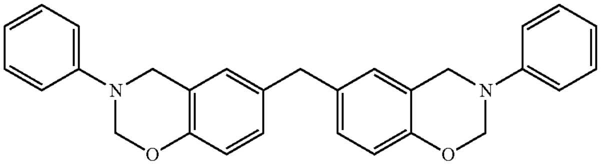 [SMILES: c1ccc(N2COc3ccc(Cc4ccc5c(c4)CN(c4ccccc4)CO5)cc3C2)cc1] | Shikoku Chemicals Co. | Mixture of monomer and oligomer 60-65% monomer content |
| Crosslinker 3, P-d type* | 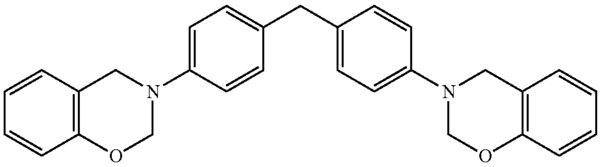 [SMILES: c1ccc2c(c1)CN(c1ccc(Cc3ccc(N4COc5ccccc5C4)cc3)cc1)CO2] | Shikoku Chemicals Co. | Mixture of monomer and oligomer 50-65% monomer content |

*B-m, F-a and P-d are generic names reflecting their synthesis.

C. Synthesis of Acrylamides.

1. Synthesis of Benzyl Acrylamide.

Benzyl acrylamide was obtained from the reaction of acrylonitrile and benzyl alcohol by using a Ritter reaction as described by Tamaddon et al. in *Tetrahedron Letters* 2007, 48(21), 3643-3646.

2. Synthesis of Phenyl Acrylamide.

Phenyl acrylamide was synthesized via the acylation reaction of aniline followed by the β-elimination of the 3-chloropropionyl amide intermediate product (intermediate product 1).

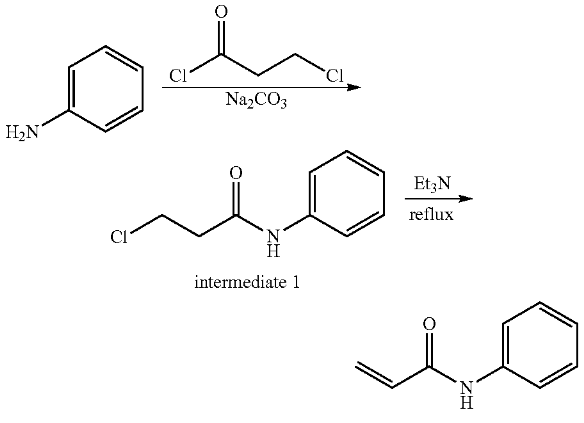

intermediate 1

Phenyl acrylamide

Aniline (0.1 mol) was dissolved in ethyl acetate (80 mL). $Na_2CO_3$ (12.72 g, 0.12 mol) dissolved in water (100 mL) was added to the reaction mixture and cooled to 0° C. 3-chloropropionyl chloride (13.86 g, 0.11 mol) dissolved in 20 ml ethyl acetate was added over 20 minutes under constant stirring. The temperature was kept at 0° C. The reaction was allowed to continue for an additional hour at room temperature. After filtration, the organic phase was isolated, washed twice with water and dried over $MgSO_4$. The solvent was evaporated under reduced pressure and recrystallization from MeOH/water yielded intermediate 1 (yield=98%, mp=118-120° C.).

Intermediate 1 (80 mmol) and triethylamine (160 mmol) were dissolved in ethyl acetate (170 mL). The mixture was refluxed for 24 hours. The reaction mixture was allowed to cool down to room temperature. The salts were removed by filtration. The organic fraction was extracted twice with 80 ml 3 N HCl, dried over $Na_2SO_4$, and evaporated under reduced pressure. Yield=89.6%, mp=106-108° C.

D. Synthesis of Sulfonamide Monomer-1.

Sulfonamide monomer-1 was synthesized by the method described in EP 894 622 (Fuji Photo Film Co.). The synthesis of sulfonamide-3 was described by Hofmann et al. in *Makromoleculare Chemie* 1976, 177, 1791-1813.

E. Synthesis of the Inventive and Comparative Resins.

The resins according to the present invention (inventive polymers 1 to 13) and the comparative polymer 1 were prepared according to the following procedures. The monomer composition is given in Table 4 and the initiation temperature, the time in minutes for the post-initiation and the molecular weights (GPC) are given in Table 5.

In a 250 ml reactor, the monomers (70 mmol in total) were added to 35.4 g of gamma-butyrolactone (GBL) and the mixture was heated to 140° C., while stirring at 200 rpm. Upon complete dissolution of the monomer mixture, the reaction mixture was allowed to cool down to the initiation temperature as indicated in Table 4. 80 μL of Trigonox DC-50 (0.14 mmol, commercially available from AKZO NOBEL) was added at once, immediately followed by the addition of 1121 μL of a 25 wt-% solution of Trigonox-141 (0.7 mmol, commercially available from AKZO NOBEL) in GBL. The temperature was decreased to the post-initiation temperature. 813 μl, of a 33 wt-% of V-59 (1.4 mmol, commercially available at Wako Fine Chemical Co.) in 1-methoxy-2-propanol were added at 75° C. The polymerization was allowed to continue for at least 30 minutes (Table 4). The reaction mixture was diluted with 19.0 mL of 1-methoxy-2-propanol. The reaction mixture was allowed to cool down to room temperature. The binder solution was exempt of residual monomers. The solution was used directly for the preparation of the coating solutions without further purification. The inventive polymers 10 and 12 were synthesized according to the same method by replacing V-59 for the post-initiation by 874 μL of a 20 wt-% of V-601 (1.4 mmol, commercially available at Wako Fine Chemical Co.) in 1-methoxy-2-propanol were added for the post-initiation at 105° C. during 4 hours.

The inventive polymers 1, 5, 6, 7, 8, 11, and 13 were synthesized in dimethylacetamide (DMA) as a reaction solvent. The method is similar than the above described except that 490 μL of a 33 wt-% of V-59 (0.84 mmol, commercially available at Wako Fine Chemical Co.) in DMA were used for the initiation step at 75° C. and that it does not require a pre-heating at 140° C. for complete dissolution of the monomers. After the post-initiation, the reaction was precipitated into deionized water, filtrated over Büchner and dried in vacuum at 45° C. for hours. The white-yellowish powder was exempt of residual monomers.

The presence of residual monomers was analyzed by using thin layer chromatography in comparison with original samples of the different monomers. Partisil KC18F plates (supplied by Whatman) and MeOH/0.5 M NaCl 60/40 were used as stationary and mobile phase, respectively. In none of the samples, residual monomer were detected.

The molecular weight of the copolymers ($M_n$, $M_w$, $M_w/M_n$) was analyzed by size exclusion chromatography (SEC) by using dimethyl acetamide/0.21% LiCl as an eluent and 3 mixed-B columns that were calibrated against linear polystyrene standards. The analytical results are given in Table 4.

TABLE 4

Monomer composition of the comparative polymer 1 and the inventive polymers 1 to 13.

| | Monomer 1 | Monomer 2 | Monomer 3 |
|---|---|---|---|
| Comp. polymer 1 | 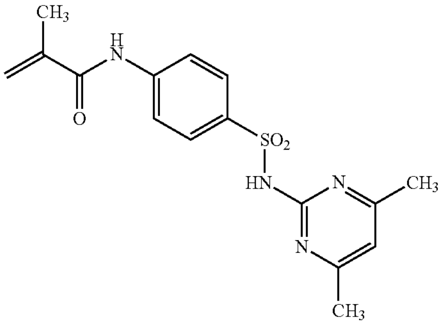 [SMILES: C=C(C)C(=O)Nc1ccc(S(=O)(=O)Nc2nc(C)cc(C)n2)cc1]<br>65 mol % | 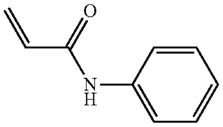<br>35 mol % | – |
| Inventive Polymer 1 | 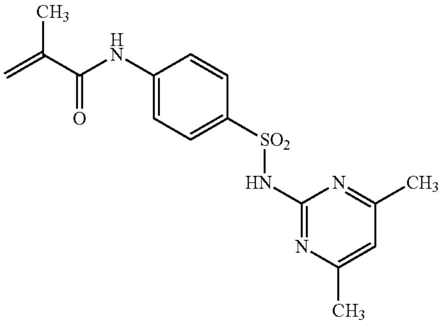 [SMILES: C=C(C)C(=O)Nc1ccc(S(=O)(=O)Nc2nc(C)cc(C)n2)cc1]<br>64 mol % | 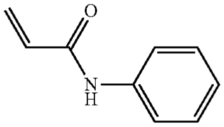<br>34 mol % | 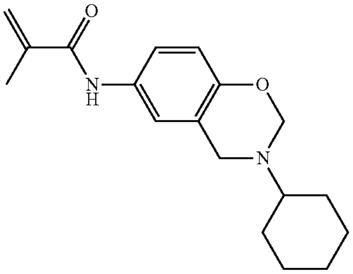 [SMILES: C=C(C)C(=O)Nc1ccc2c(c1)CN(C1CCCCC1)CO2]<br>2 mol % |
| Inventive Polymer 2 | 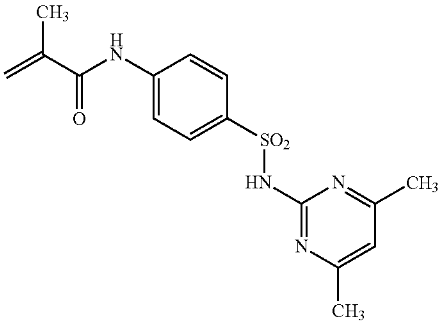 [SMILES: C=C(C)C(=O)Nc1ccc(S(=O)(=O)Nc2nc(C)cc(C)n2)cc1]<br>64 mol % | 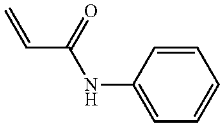<br>34 mol % | 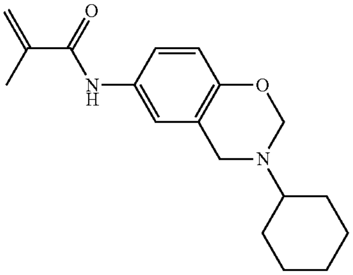 [SMILES: C=C(C)C(=O)Nc1ccc2c(c1)CN(C1CCCCC1)CO2]<br>2 mol % |

TABLE 4-continued
Monomer composition of the comparative polymer 1 and the inventive polymers 1 to 13.
| | Monomer 1 | Monomer 2 | Monomer 3 |
|---|---|---|---|
| Inventive Polymer 3 | 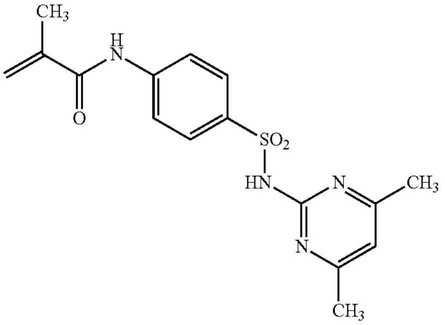 [SMILES: C=C(C)C(=O)Nc1ccc(S(=O)(=O)Nc2nc(C)cc(C)n2)cc1] | 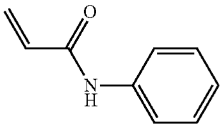 | 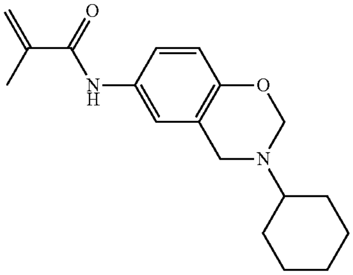 [SMILES: C=C(C)C(=O)Nc1ccc2c(c1)CN(C1CCCCC1)CO2] |
| | 64 mol % | 34 mol % | 2 mol % |
| Inventive Polymer 4 | 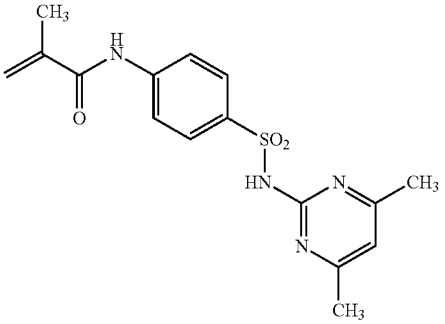 [SMILES: C=C(C)C(=O)Nc1ccc(S(=O)(=O)Nc2nc(C)cc(C)n2)cc1] | 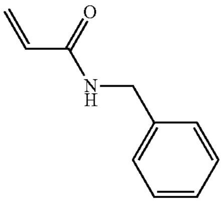 | 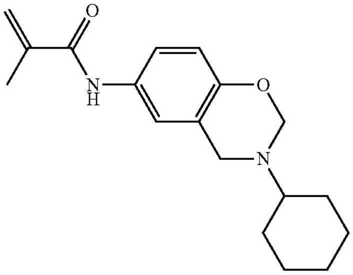 [SMILES: C=C(C)C(=O)Nc1ccc2c(c1)CN(C1CCCCC1)CO2] |
| | 64 mol % | 34 mol % | 2 mol % |
| Inventive Polymer 5 | 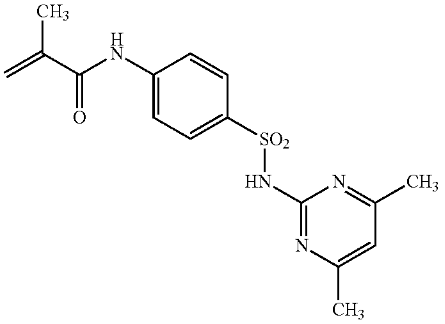 [SMILES: C=C(C)C(=O)Nc1ccc(S(=O)(=O)Nc2nc(C)cc(C)n2)cc1] | 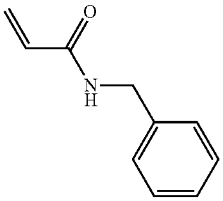 | 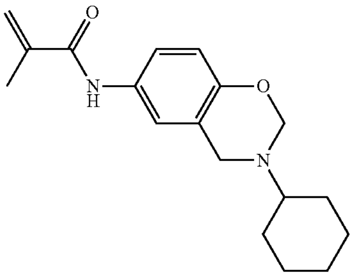 [SMILES: C=C(C)C(=O)Nc1ccc2c(c1)CN(C1CCCCC1)CO2] |
| | 64.5 mol % | 34.5 mol % | 1 mol % |
| Inventive Polymer 6 | 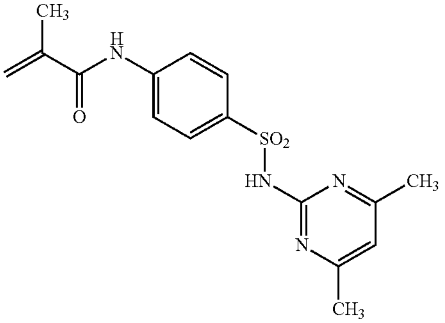 [SMILES: C=C(C)C(=O)Nc1ccc(S(=O)(=O)Nc2nc(C)cc(C)n2)cc1] | 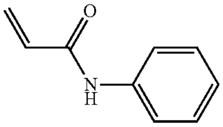 | 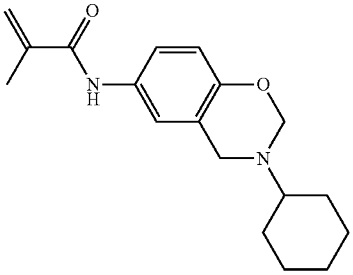 [SMILES: C=C(C)C(=O)Nc1ccc2c(c1)CN(C1CCCCC1)CO2] |
| | 64.5 mol % | 34.5 mol % | 1 mol % |

TABLE 4-continued
Monomer composition of the comparative polymer 1 and the inventive polymers 1 to 13.
| | Monomer 1 | Monomer 2 | Monomer 3 |
|---|---|---|---|
| Inventive Polymer 7 | 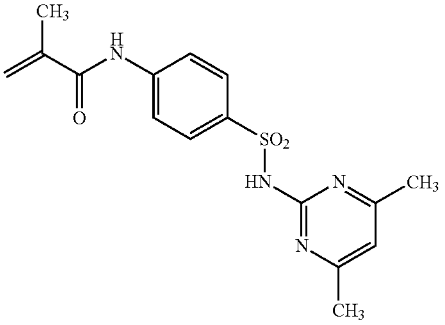 [SMILES: C=C(C)C(=O)Nc1ccc(S(=O)(=O)Nc2nc(C)cc(C)n2)cc1] | 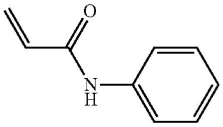 | 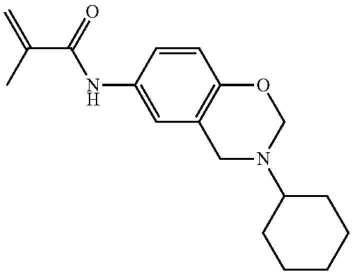 [SMILES: C=C(C)C(=O)Nc1ccc2c(c1)CN(C1CCCCC1)CO2] |
| | 64.5 mol % | 34.5 mol % | 1 mol % |
| Inventive Polymer 8 | 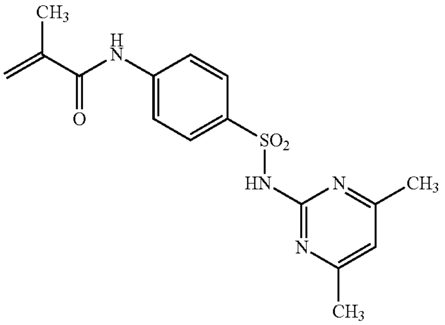 [SMILES: C=C(C)C(=O)Nc1ccc(S(=O)(=O)Nc2nc(C)cc(C)n2)cc1] | 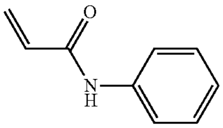 | 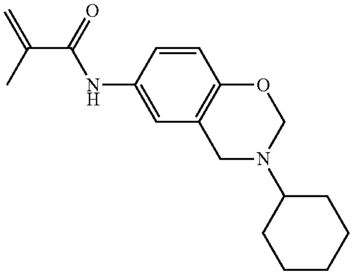 |
| | 62 mol % | 33 mol % | 5 mol % |
| Inventive Polymer 9 | 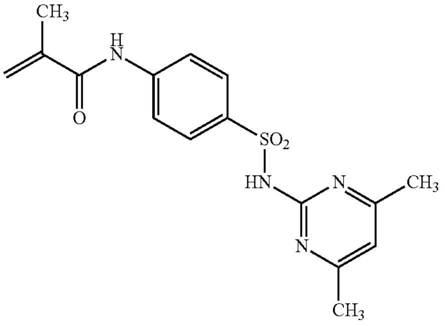 | 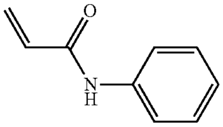 | 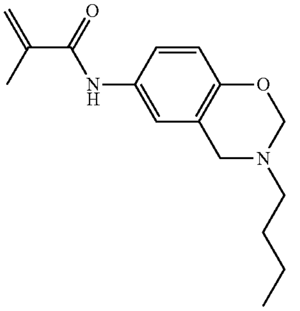 [SMILES: C=C(C)C(=O)Nc1ccc2c(c1)CN(CCCC)CO2] |
| | 62 mol % | 33 mol % | 2 mol % |
| Inventive Polymer 10 | 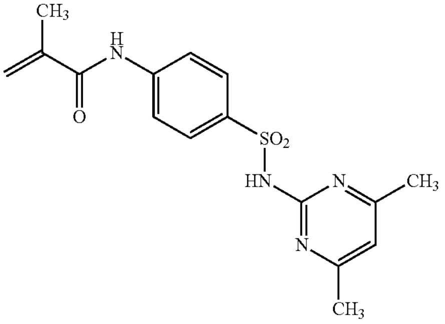 [SMILES: C=C(C)C(=O)Nc1ccc(S(=O)(=O)Nc2nc(C)cc(C)n2)cc1] | 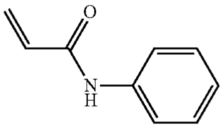 | 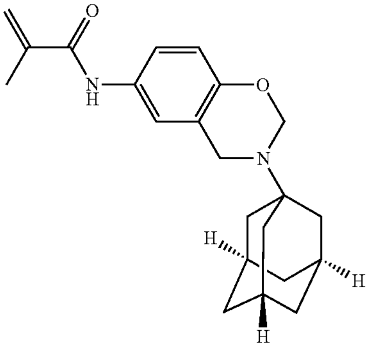 [SMILES: C=C(C)C(=O)Nc1ccc2c(c1)CN(C13C[C@H]4C[C@@H](C1)C[C@@H](C3)C4)CO2] |
| | 62 mol % | 33 mol % | 2 mol % |

TABLE 4-continued

Monomer composition of the comparative polymer 1 and the inventive polymers 1 to 13.

| | Monomer 1 | Monomer 2 | Monomer 3 |
|---|---|---|---|
| Inventive Polymer 11 | 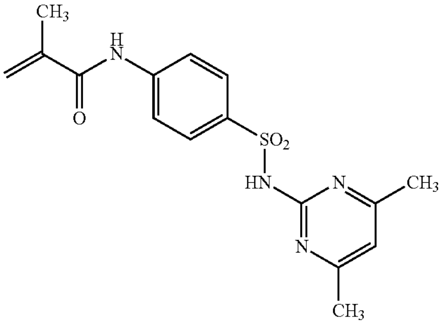 [SMILES: C=C(C)C(=O)Nc1ccc(S(=O)(=O)Nc2nc(C)cc(C)n2)cc1] | 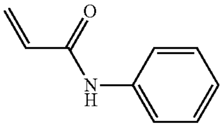 | 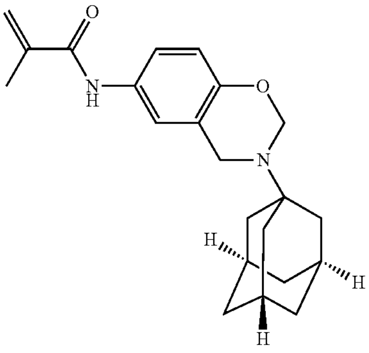 [SMILES: C=C(C)C(=O)Nc1ccc2c(c1)CN(C13C[C@H]4C[C@@H](C1)C[C@@H](C3)C4)CO2] |
| | 62 mol % | 33 mol % | 2 mol % |
| Inventive Polymer 12 | 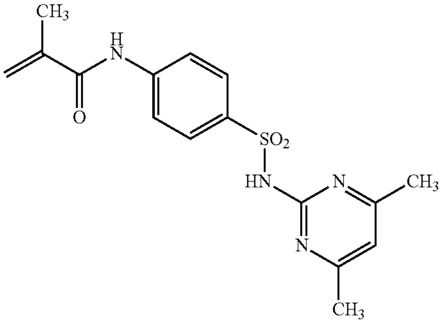 [SMILES: C=C(C)C(=O)Nc1ccc(S(=O)(=O)Nc2nc(C)cc(C)n2)cc1] | 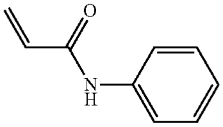 | 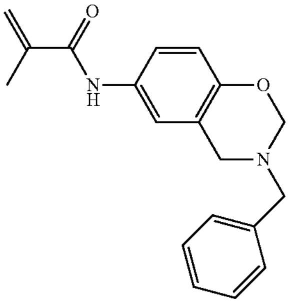 [SMILES: C=C(C)C(=O)Nc1ccc2c(c1)CN(Cc1ccccc1)CO2] |
| | 62 mol % | 33 mol % | 2 mol % |
| Inventive Polymer 13 | 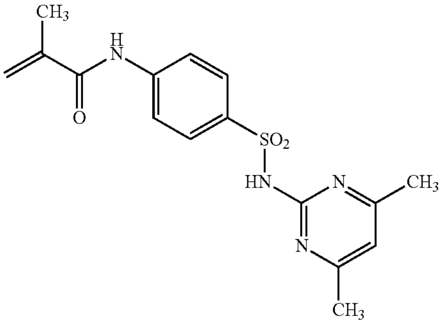 [SMILES: C=C(C)C(=O)Nc1ccc(S(=O)(=O)Nc2nc(C)cc(C)n2)cc1] | 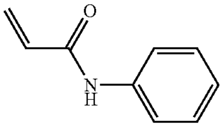 | 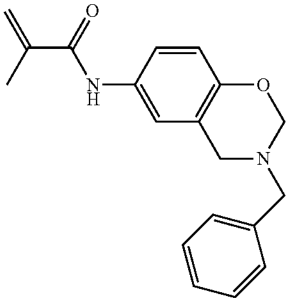 [SMILES: C=C(C)C(=O)Nc1ccc2c(c1)CN(Cc1ccccc1)CO2] |
| | 62 mol % | 33 mol % | 2 mol % |

TABLE 5

Experimental data and analytical results.

| | Initiation temp./ Solvent* | Post-initiation temp./time | $M_n$ | $M_w$ | $M_w/M_n$ |
|---|---|---|---|---|---|
| Comp. polymer 1 | 105° C./GBL | 130° C./240 min | 40,740 | 129,760 | 3.18 |
| Inv. Polymer 1 | 75° C./DMA | 75° C./240 min | 98,100 | 462,050 | 4.71 |
| Inv. Polymer 2 | 102° C./GBL | 75° C./240 min | 62,200 | 344,600 | 5.54 |
| Inv. Polymer 3 | 100° C./GBL | 75° C./30 min | 56,700 | 199,580 | 3.52 |

TABLE 5-continued

| Experimental data and analytical results. | | | | | |
|---|---|---|---|---|---|
| | Initiation temp./ Solvent* | Post-initiation temp./time | $M_n$ | $M_w$ | $M_w/M_n$ |
| Inv. Polymer 4 | 102° C./GBL | NO | 54,800 | 409,360 | 7.47 |
| Inv. Polymer 5 | 75° C./DMA | 75° C./240 min | 78,400 | 248,200 | 3.16 |
| Inv. Polymer 6 | 75° C./DMA | 75° C./120 min | 71,600 | 189,000 | 2.64 |
| Inv. Polymer 7 | 75° C./DMA | NO | 151,200 | 319,000 | 2.11 |
| Inv. Polymer 8 | 75° C./DMA | 75° C./240 min | 56,000 | 163,300 | 2.92 |
| Inv. Polymer 9 | 100° C./GBL | 75° C./120 min | 87,500 | 501,500 | 5.73 |
| Inv. Polymer 10 | 100° C./GBL | 105° C./240 min | 48,500 | 152,400 | 3.14 |
| Inv. Polymer 11 | 75° C./DMA | 75° C./240 min | 46,800 | 102,000 | 2.18 |
| Inv. Polymer 12 | 100° C./GBL | 105° C./240 min | 37,000 | 138,300 | 3.74 |
| Inv. Polymer 13 | 75° C./DMA | 75° C./240 min | 46,800 | 102,000 | 2.18 |

*GBL: γ-butyrolactone; DMA: N,N-dimethylacetamide

II. Preparation of the Lithographic Support S-01

A 0.3 mm thick aluminium foil was degreased by spraying with an aqueous solution containing 34 g/l NaOH at 70° C. for 6 seconds and rinsed with demineralised water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/dm$^2$ (charge density of about 80° C./dm$^2$). Afterwards, the aluminium foil was desmutted by etching with an aqueous solution containing 145 g/l of sulfuric acid at 80° C. for 5 seconds and rinsed with demineralised water for 4 seconds. The foil was subsequently subjected to anodic oxidation during 10 seconds in an aqueous solution containing 145 g/l of sulfuric acid at a temperature of 57° C. and a current density of 33 A/dm$^2$ (charge density of 330 C/dm$^2$), then washed with demineralised water for 7 seconds and post-treated for 4 seconds (by spray) with a solution containing 2.2 g/l polyvinylphosphonic acid at 70° C., rinsed with demineralised water for 3.5 seconds and dried at 120° C. for 7 seconds.

The support thus obtained was characterised by a surface roughness Ra of 0.35-0.4 μm (measured with interferometer NT1100) and an anodic weight of 4.0 g/m$^2$.

III. Test Samples and Printing Plate Precursors Comprising Benzoxazine Compounds According to Structures (I) or (II)

1. Preparation of the Test Samples Ts-01 to Ts-13.

The test samples were TS-01 to TS-13 were produced by applying a coating solution onto the above described lithographic support S-01. The coating solution contains the ingredients as defined in Table 6, dissolved in a mixture of the following solvents: 53% by volume of tetrahydrofuran, 20% by volume of Dowanol PM (1-methoxy-2-propanol, commercially available from DOW CHEMICAL Company) and 27% by volume of gamma-butyrolactone. The coating solution was applied at a wet coating thickness of 20 μm and then dried at 135° C. for 3 minutes. The dry coating weight amount in g/m$^2$ of each of the ingredients is indicated in Table 6.

TABLE 6

| dry coating weight. | | | | | | |
|---|---|---|---|---|---|---|
| | Comp. polymer 1 (1) | Crystal violet (2) | Tegoglide 410 (3) | Benzoxazine crosslinker (4) g/m$^2$ | | |
| Test sample | g/m$^2$ | g/m$^2$ | g/m$^2$ | 1 | 2 | 3 |
| TS-01, comp. | 0.660 | 0.01 | 0.001 | — | — | — |
| TS-02, inv. | 0.660 | 0.01 | 0.001 | 0.02 | — | — |
| TS-03, inv. | 0.660 | 0.01 | 0.001 | 0.04 | — | — |
| TS-04, inv. | 0.660 | 0.01 | 0.001 | 0.06 | — | — |
| TS-05, inv. | 0.660 | 0.01 | 0.001 | 0.08 | — | — |
| TS-06, inv. | 0.660 | 0.01 | 0.001 | — | 0.02 | — |
| TS-07, inv. | 0.660 | 0.01 | 0.001 | — | 0.04 | — |
| TS-08, inv. | 0.660 | 0.01 | 0.001 | — | 0.06 | — |
| TS-09, inv. | 0.660 | 0.01 | 0.001 | — | 0.08 | — |
| TS-10, inv. | 0.660 | 0.01 | 0.001 | — | — | 0.02 |
| TS-11, inv. | 0.660 | 0.01 | 0.001 | — | — | 0.04 |
| TS-12, inv. | 0.660 | 0.01 | 0.001 | — | — | 0.06 |
| TS-13, inv. | 0.660 | 0.01 | 0.001 | — | — | 0.08 |

(1) See tables 4 and 5 above;
(2) Crystal Violet, commercially available from CIBA-GEIGY;
(3) TEGOGLIDE 410 is a copolymer of polysiloxane and poly(alkylene oxide), commercially available from TEGO CHEMIE SERVICE GmbH;
(4) Benzoxazine crosslinker 1, 2 and 3: see above.

2. Chemical Resistance Test.

The chemical resistance of the test samples was evaluated as follows. Part of each of the test samples TS-01 to TS-13 was put through a dynamic baking oven (Top Line OG15 dynamic oven from Systemtechnik Haase GmbH) working at 270° C. and 1.1 m/min. This resulted in a so-called "baked test sample".

Subsequently a drop of 40 μl of RevivaPlate (commercially available from Agfa Graphics N.V.) was applied onto the surface of the coating of the baked test sample and was left there for 3 minutes. Finally, this drop was wiped off with a cotton pad and the test sample was rinsed with tap water and left to dry.

The resulting relative coating loss (RCL) was measured with a GretagMacBeth D19c densitometer (commercially available from Gretag-Macbeth AG) and defined as follows:

Relative Coating Loss (RCL,%)=[1−(optical density after 3 minutes of contact with RevivaPlate/optical density without contact with RevivaPlate*]×100

*: commercially available from Agfa Graphics N.V.

3. Results of the Chemical Resistance Test.

The results of the 3 minutes contact with RevivaPlate (plate cleaner, commercially available from Agfa Graphics N.V.) for the baked test samples are given in Table 7.

TABLE 7

Results of the chemical resistance test.

| Test samples | RCL* (%) |
|---|---|
| TS-01, comp. | 100 |
| TS-02, inv. | 43 |
| TS-03, inv. | 16 |
| TS-04, inv. | 8 |
| TS-05, inv. | 2 |
| TS-06, inv. | 49 |
| TS-07, inv. | 16 |
| TS-08, inv. | 7 |
| TS-09, inv. | 2 |
| TS-10, inv. | 75 |
| TS-11, inv. | 24 |
| TS-12, inv. | 16 |
| TS-13, inv. | 10 |

*Relative Coating Loss: see above.

These results show that the compounds comprising a benzoxazine group provide a substansive improvement of the chemical resistance of the coating after baking.

4. Preparation of the Printing Plate Precursors PPP-01 to PPP-13.

The printing plate precursors PPP-01 to PPP-13 were produced by first applying onto the above described support S-01 the coating solution containing the ingredients as defined in Table 8 dissolved in a mixture of the following solvents: 53% by volume of tetrahydrofuran, 20% by volume of Dowanol PM (1-methoxy-2-propanol, commercially available from DOW CHEMICAL Company) and 27% by volume of gamma-butyrolactone. The coating solution was applied at a wet coating thickness of 20 μm and then dried at 135° C. for 3 minutes.

TABLE 8 composition of the first coating.

| Printing plate precursor | Comp. polymer 1 (1) g/m² | Crystal violet (2) g/m² | Tegoglide 410 (3) g/m² | Benzoxazine crosslinker (4) g/m² 1 | 2 | 3 |
|---|---|---|---|---|---|---|
| PPP-01, comp. | 0.660 | 0.01 | 0.001 | — | — | — |
| PPP-02, inv. | 0.660 | 0.01 | 0.001 | 0.02 | — | — |
| PPP-03, inv. | 0.660 | 0.01 | 0.001 | 0.04 | — | — |
| PPP-04, inv. | 0.660 | 0.01 | 0.001 | 0.06 | — | — |
| PPP-05, inv. | 0.660 | 0.01 | 0.001 | 0.08 | — | — |
| PPP-06, inv. | 0.660 | 0.01 | 0.001 | — | 0.02 | — |
| PPP-07, inv. | 0.660 | 0.01 | 0.001 | — | 0.04 | — |
| PPP-08, inv. | 0.660 | 0.01 | 0.001 | — | 0.06 | — |
| PPP-09, inv. | 0.660 | 0.01 | 0.001 | — | 0.08 | — |

TABLE 8-continued composition of the first coating.

| Printing plate precursor | Comp. polymer 1 (1) g/m² | Crystal violet (2) g/m² | Tegoglide 410 (3) g/m² | Benzoxazine crosslinker (4) g/m² 1 | 2 | 3 |
|---|---|---|---|---|---|---|
| PPP-10, inv. | 0.660 | 0.01 | 0.001 | — | — | 0.02 |
| PPP-11, inv. | 0.660 | 0.01 | 0.001 | — | — | 0.04 |
| PPP-12, inv. | 0.660 | 0.01 | 0.001 | — | — | 0.06 |
| PPP-13, inv. | 0.660 | 0.01 | 0.001 | — | — | 0.08 |

(1) See tables 4 and 5 above;
(2) Crystal Violet, commercially available from CIBA-GEIGY;
(3) TEGOGLIDE 410 is a copolymer of polysiloxane and poly(alkylene oxide), commercially available from TEGO CHEMIE SERVICE GmbH;
(4) Benzoxazine crosslinker 1, 2 and 3: see above.

Subsequently, a second coating solution containing the ingredients as defined in Table 9 dissolved in a mixture of the following solvents: 50% by volume of MEK, 50% by volume of Dowanol PM, which is 1-methoxy-2-propanol, commercially available from DOW CHEMICAL Company, was applied onto the coated support. The second coating solution was applied at a wet coating thickness of 16 μm and then dried at 125° C. for 3 minutes. The dry coating weight amount in g/m² of each of the ingredients is indicated in Table 9. The printing plate precursors PPP-01 to PPP-13 were obtained.

TABLE 9 composition of the second coating.

| INGREDIENTS | Second coating g/m² |
|---|---|
| Alnovol SPN402 (1) | 0.653 |
| SOO94 (2) | 0.025 |
| Crystal Violet (3) | 0.010 |
| Tegoglide 410 (4) | 0.001 |
| TMCA (5) | 0.056 |

(1) Alnovol SPN402 is a 44.0 wt. % solution in Dowanol PM of a m,p-cresol-cresol-xylenol formaldehyde novolac resin commercially available from Clariant GmbH.
(2) SOO94 is an IR absorbing cyanine dye, commercially available from FEW CHEMICALS; the chemical structure of SOO94 is given above (IR-1).
(3) Crystal Violet, commercially available from CIBA-GEIGY.
(4) TEGOGLIDE 410 is a copolymer of polysiloxane and poly(alkylene oxide), commercially available from TEGO CHEMIE SERVICE GmbH.
(5) TMCA is 3,4,5-trimethoxy cinnamic acid

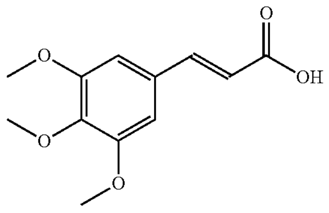 [SMILES: COc1cc(/C=C/C(=O)O)cc(OC)c1OC]

5. Imaging and Processing.

The obtained printing plate precursors PPP-01 to PPP-13 were exposed with a Creo Trendsetter 3244 (external drum platesetter available from Kodak), having a 20 W thermal head, operating at 150 rpm. The imaging resolution amounted to 2400 m dpi. Each printing plate precursor was exposed to several energy densities (exposure series).

Subsequently the exposed printing plate precursor were processed in an Elantrix 85H processor (processing apparatus commercially available from Agfa Graphics N.V.). The developer section was filled with Energy Elite Improved Developer (commercially available from Agfa Graphics N.V.) and the gum/finisher section with RC795c (commercially available from Agfa Graphics N.V.). The developer temperature was 25° C., the developer dwell time amounted to 22 s.

6. Sensitivity Results.

The sensitivity was determined on the processed plates as the energy density at which the 1×1 pixel checkerboard pattern has a 52% dot area coverage (as measured with a GretagMacbeth D19C densitometer, commercially available from GretagMacbeth AG). The results for the sensitivity are given in Table 10.

TABLE 10 sensitivity results.

| Printing Plate | Sensitivity mJ/cm$^2$ |
|---|---|
| PP-01; COMP. | 108 |
| PP-02; INV. | 110 |
| PP-03; INV. | 102 |
| PP-04; INV. | 106 |
| PP-05; INV. | 108 |
| PP-06; INV. | 108 |
| PP-07; INV. | 147 |
| PP-08; INV. | 149 |
| PP-09; INV. | 136 |
| PP-10; INV. | 136 |
| PP-11; INV. | 131 |
| PP-12; INV. | 136 |
| PP-13; INV. | 132 |

The results in Table 10 show that the sensitivity obtained for the printing plates of the invention, i.e. the printing plates comprising the compound containing the benzoxazine group, are similar to the sensitivity of the printing plate of the prior art (the printing plate not containing a benzaxozine compound).

IV. Test Samples and Printing Plate Precursors Comprising Benzoxazine Compounds According to Structures (III), (V) or (VII)

1. Preparation of the Test Samples TS-14 to TS-20.

The test samples TS-14 to TS-20 were prepared following the same procedure as in Example 1. The dry coating weight amount in g/m$^2$ of each of the ingredients in the test samples TS-14 to TS-20 is indicated in Table 11.

TABLE 11

Ingredients of the test samples TS-14 to TS-20.

| Ingredients | TS-14 COMP g/m$^2$ | TS-15 INV g/m$^2$ | TS-16 INV g/m$^2$ | TS-17 INV g/m$^2$ | TS-18 INV g/m$^2$ | TS-19 INV g/m$^2$ | TS-20 INV g/m$^2$ |
|---|---|---|---|---|---|---|---|
| Comp. polymer 1 (1) | 0.660 | — | — | — | — | — | — |
| Crystal Violet (2) | 0.010 | 0.010 | 0.010 | 0.010 | 0.010 | 0.010 | 0.010 |
| Tegoglide 410 (3) | 0.001 | 0.001 | 0.001 | 0.001 | 0.001 | 0.001 | 0.001 |
| Inv. Polymer 5 (1) | — | 0.660 | — | — | — | — | — |
| Inv. Polymer 3 (1) | — | — | 0.660 | — | — | — | — |
| Inv. Polymer 8 (1) | — | — | — | 0.660 | — | — | — |
| Inv. Polymer 9 (1) | — | — | — | — | 0.660 | — | — |
| Inv. Polymer 10 (1) | — | — | — | — | — | 0.660 | — |
| Inv. Polymer 12 (1) | — | — | — | — | — | — | 0.660 |

(1) See tables 4 and 5 above;

(2) Crystal Violet, commercially available from CIBA-GEIGY.

(3) TEGOGLIDE 410 is a copolymer of polysiloxane and poly(alkylene oxide), commercially available from TEGO CHEMIE SERVICE GmbH.

2. Results of the Chemical Resistance Test.

The chemical resistance test was performed on the baked test samples TS-14 to TS-20 following the same procedure as described in Example 1. The results are given in Table 12.

TABLE 12

Results of the chemical resitance test.

| Test Samples | RCL* (%) |
|---|---|
| TS-14, comp. | 100 |
| TS-15, inv. | 37 |
| TS-16, inv. | 18 |
| TS-17, inv. | 7 |
| TS-18, inv. | 18 |
| TS-19, inv. | 25 |
| TS-20, inv. | 30 |

*Relative Coating Loss: see above.

The results show that the compounds comprising a benzoxazine group result in a substansive improvement of the chemical resistance of the coating after baking.

3. Abrasion Resistance Test.

The mechanical resistance of the printing plates was measured by the abrasian resistance test. The abrasion resistance of the baked test samples TS-14 (Comparative Example), and TS-16 and TS-17 (both Inventive Examples) was tested as follows.

Six round rubber (hardness 75 Shore A) stamps with a diameter of 15 mm were simultaneously rotated in contact with the test sample and this with a load of 9.5 N each and while the coating is wet (4 ml demineralised water per contact area). Fifty test cycles were applied to each test sample, each test cycle consisting of 25 seconds of contact at a rotational speed of 100 rpm and 1 second of non-contact in order to allow the demineralised water to recover the contact area.

In this way, five samples of each test sample TS-14, TS-16 and TS-17 were tested, resulting in a total of 30 contact areas subjected to abrasion.

A quantitative assessment of the resulting wear of the contact areas of the test samples was performed as follows. Each of the 30 contact areas subjected to abrasion was scanned in with a HP Scanjet 5590P (commercially available from HP) both before and after rotational contact abrasion. The automatic exposure and colour adjustment parameters setting was switched off and instead the following exposure parameter values were set manually: "0", "−69" and "0" for respectively the high lights, the shadows and the midtones. The resulting images were converted to 8 bit grey-scale images (grey-level values from 0 to 255, whereby 0 represents “black” and 255 represents “white”). The coating wear was calculated from the is measured change in coating grey-level value:

Relative coating wear (RCW,%)=[(grey-level value after rotational abrasion/grey-level value before rotational abrasion)−1]×100

The results for baked test samples TS-14, TS-16 and TS-17 are given in Table 13.

TABLE 13 results of the abrasion test.

| Test samples | RCW* (%) |
|---|---|
| TS-14, COMP. | 21.4 |
| TS-16, INV. | 17.4 |
| TS-17, INV. | 12.6 |

*relative coating wear, see above.

The results show that the compound including a benzoxazine group significantly improves the abrasion resistance of the test samples after baking.

4. Preparation of the Printing Plate Precursors PPP-14 and 17.

The printing plate precursors PPP-14 and PPP-17 were produced by first coating onto the above described support S-01 the coating solution as defined in Table 14 dissolved in a mixture of the following solvents: 53% by volume of tetrahydrofuran, 20% by volume of Dowanol PM (1-methoxy-2-propanol, commercially available from DOW CHEMICAL Company) and 27% by volume of gamma-butyrolactone. The coating solution was applied at a wet coating thickness of 20 μm and then dried at 135° C. for 3 minutes.

TABLE 14

Composition the first coating of PPP-14 and PPP-17.

| Ingredients* | PPP-14, COMP g/m$^2$ | PPP-17, INV g/m$^2$ |
|---|---|---|
| Comp. polymer 1 (1) | 0.660 | — |
| Crystal Violet (2) | 0.010 | 0.010 |
| Tegoglide 410 (3) | 0.001 | 0.001 |
| Inv. Polymer 8 (1) | — | 0.660 |

(1) See Tables 4 and 5 above;
(2) Crystal Violet, commercially available from CIBA-GEIGY;
(3) TEGOGLIDE 410 is a copolymer of polysiloxane and poly(alkylene oxide), commercially available from TEGO CHEMIE SERVICE GmbH.

Subsequently, a second coating solution containing the ingredients as defined in Table 9 above (Example 1) dissolved in a mixture of the following solvents: 50% by volume of MEK, 50% by volume of Dowanol PM, which is 1-methoxy-2-propanol, commercially available from DOW CHEMICAL Company, was applied onto the coated support. The second coating solution was applied at a wet coating thickness of 16 μm and then dried at 125° C. for 3 minutes.

5. Imaging and Processing.

The sensitivity was determined on the processed plates as the energy density at which the 1×1 pixel checkerboard pattern has 52% dot area coverage (as measured with a GretagMacbeth D19C densitometer, commercially available from GretagMacbeth AG). The results for the sensitivity are given in Table 15.

TABLE 15 sensitivity results.

| Printing Plate | Sensitivity mJ/cm$^2$ |
|---|---|
| PP-14, COMP. | 103 |
| PP-17, INV. | 108 |

The results in Table 15 show that the sensitivity obtained for the printing plate of the invention, i.e. the printing plates comprising the compound containing the benzoxazine group is similar to the sensitivity of the printing plate of the prior art (a printing plate not containing a benzaxozine compound).

The invention claimed is:

1. A positive-working lithographic printing plate precursor which comprises on a support having a hydrophilic surface or which is provided with a hydrophilic layer, a heat and/or light-sensitive coating including an infrared absorbing agent and an alkali soluble resin including a benzoxazine group, wherein the alkali soluble resin comprises a monomeric unit derived from the monomer according to the following structure (V):

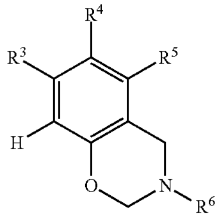

wherein $R^3$ to $R^6$ represent hydrogen, a halogen, an optionally substituted straight, branched or cyclic alkyl, aralkyl, hetero-aralkyl, (di)alkylamine, aryl, heteroaryl group, or a structural moiety comprising an ethylenically unsaturated polymerizable group and/or combinations thereof;

each of adjacent $R^3$ to $R^5$ may represent the necessary atoms to form one or more cyclic structure(s); and with the proviso that at least one of $R^3$ to $R^6$ represents or comprises a structural moiety including an ethylenically unsaturated polymerizable group.

2. A printing plate precursor according to claim 1 wherein the ethylenically unsaturated polymerizable group is represented by:

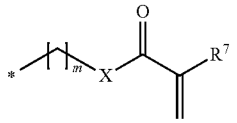

wherein

X represents oxygen, sulfur or an optionally substituted nitrogen;

m represents 0, 1 or an integer greater than 1; and $R^7$ represents hydrogen, an alkyl, an alkoxy, a carboxylic acid or an ester group; and

* represents the bond whereby the ethylenically unsaturated polymerizable group is attached to structure (V).

3. A printing plate precursor according to claim 1 wherein the alkali soluble resin comprises 0.5 to 10 mol % of the monomeric unit according to structure (V).

4. A printing plate precursor according to claim 1 wherein the alkali soluble resin further comprises a monomeric unit selected from an acrylate, a methacrylate, styrene, an acrylamide, a methacrylamide or a maleimide, or a monomeric unit including a sulphonamide group.

5. A printing plate precursor according to claim 1 wherein the alkali soluble resin further comprises a monomeric unit including a sulphonamide group represented by —$NR^j$—$SO_2$—, —$SO_2$—$NR^k$— wherein $R^j$ and $R^k$ each independently represent hydrogen, an optionally substituted alkyl, alkanoyl, alkenyl, alkynyl, cycloalkyl, heterocyclic, aryl, heteroaryl, aralkyl, heteroaralkyl group or combinations thereof.

6. A printing plate precursor according to claim 5 wherein the alkali soluble resin comprises 50 to 80 mol % of the monomeric unit including a sulphonamide group.

7. A printing plate precursor according to claim 2 wherein the alkali soluble resin comprises 0.5 to 10 mol % of the monomeric unit according to structure (V).

8. A printing plate precursor according to claim 2 wherein the alkali soluble resin further comprises a monomeric unit selected from an acrylate, a methacrylate, styrene, an acrylamide, a methacrylamide or a maleimide, or a monomeric unit including a sulphonamide group.

9. A printing plate precursor according to claim 2 wherein the alkali soluble resin further comprises a monomeric unit including a sulphonamide group represented by —$NR^j$—$SO_2$—, —$SO_2$—$NR^k$— wherein $R^j$ and $R^k$ each independently represent hydrogen, an optionally substituted alkyl, alkanoyl, alkenyl, alkynyl, cycloalkyl, heterocyclic, aryl, heteroaryl, aralkyl, heteroaralkyl group or combinations thereof.

10. A method for making a positive-working lithographic printing plate comprising the steps of:

imagewise exposing a heat-sensitive lithographic printing plate precursor according to claim 1 to heat and/or infrared light;

developing said imagewise exposed precursor with an aqueous alkaline developer so that the exposed areas are dissolved; and baking the obtained plate.

11. A positive-working lithographic printing plate precursor which comprises on a support having a hydrophilic surface or which is provided with a hydrophilic layer, a heat and/or light-sensitive coating including an infrared absorbing agent and a compound including a benzoxazine group represented by one of the following structures:

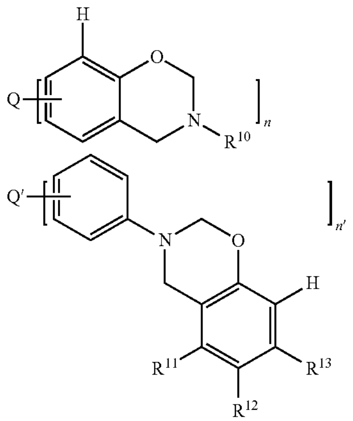

wherein

Q and Q' independently represent an optionally substituted alkylidene or hetero-alkylidene group, an optionally substituted nitrogen, an oxygen, a sulphone, a sulphoxide, a carbonyl, a thioether, a thiol or a phosphine oxide group;

$R^{10}$ represents hydrogen or an optionally substituted alkyl, alicyclic alkyl, aralkyl, aryl or heteroaryl group;

$R^{11}$, $R^{12}$ and $R^{13}$ independently represent hydrogen, a halogen or an optionally substituted alkyl, alicyclic alkyl, aralkyl, aryl or heteroaryl group; and n and n' independently represent an integer comprised between 1 and 4, wherein the compound including a benzoxazine group is present in the coating in an amount comprised between 0.01 g/m$^2$ to 1 g/m$^2$.

12. A method for making a positive-working lithographic printing plate comprising the steps of:

imagewise exposing a heat-sensitive lithographic printing plate precursor according to claim 11 to heat and/or infrared light;

developing said imagewise exposed precursor with an aqueous alkaline developer so that the exposed areas are dissolved; and baking the obtained plate.

* * * * *